US009672806B2

(12) United States Patent
Uhle et al.

(10) Patent No.: US 9,672,806 B2
(45) Date of Patent: Jun. 6, 2017

(54) APPARATUS AND METHOD FOR DETERMINING A MEASURE FOR A PERCEIVED LEVEL OF REVERBERATION, AUDIO PROCESSOR AND METHOD FOR PROCESSING A SIGNAL

(71) Applicant: Fraunhofer-Gesellschaft zur Foerderung der angewandten Forschung e.V., Munich (DE)

(72) Inventors: Christian Uhle, Nuremberg (DE); Jouni Paulus, Erlangen (DE); Juergen Herre, Buckenhof (DE); Peter Prokein, Erlangen (DE); Oliver Hellmuth, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 398 days.

(21) Appl. No.: 14/016,066

(22) Filed: Aug. 31, 2013

(65) Prior Publication Data

US 2014/0072126 A1 Mar. 13, 2014

Related U.S. Application Data

(63) Continuation of application No. PCT/EP2012/053193, filed on Feb. 24, 2012.

(Continued)

(30) Foreign Application Priority Data

Jun. 27, 2011 (EP) .................................. 111 71 488

(51) Int. Cl.
*H03G 3/00* (2006.01)
*G10K 15/08* (2006.01)

(Continued)

(52) U.S. Cl.
CPC ............. *G10K 15/08* (2013.01); *H04R 29/00* (2013.01); *H04S 5/005* (2013.01); *H04S 7/30* (2013.01);

(Continued)

(58) Field of Classification Search
CPC combination set(s) only.
See application file for complete search history.

(56) References Cited

U.S. PATENT DOCUMENTS

2005/0100171 A1* 5/2005 Reilly .................. G10H 1/0091 381/63
2007/0253564 A1* 11/2007 Katayama ............... H04S 3/008 381/63

(Continued)

FOREIGN PATENT DOCUMENTS

CN 101341793 A 1/2009
EP 1565036 A2 8/2005

(Continued)

OTHER PUBLICATIONS

"Algorithms to measure audio programme loudness and true-peak audio level", International Telecommunication Union, Radiocommunication Study Groups; Document 6C/TEMP/219(Rev.2); Revision 1 to Document 6/272-E, Nov. 18, 2010, Aug. 2006, 8 pages.

(Continued)

*Primary Examiner* — Duc Nguyen
*Assistant Examiner* — Assad Mohammed
(74) *Attorney, Agent, or Firm* — Michael A. Glenn; Perkins Coie LLP

(57) ABSTRACT

An apparatus for determining a measure for a perceived level of reverberation in a mix signal consisting of a direct signal component and a reverberation signal component, has a loudness model processor having a perceptual filter stage for filtering the dry signal component the reverberation (Continued)

signal component or the mix signal, wherein the perceptual filter stage is configured for modeling an auditory perception mechanism of an entity to obtain a filtered direct signal, a filtered reverberation signal or a filtered mix signal. The apparatus furthermore has a loudness estimator for estimating a first loudness measure using the filtered direct signal and for estimating a second loudness measure using the filtered reverberation signal or the filtered mix signal, where the filtered mix signal is derived from a superposition of the direct signal component and the reverberation signal component. The apparatus furthermore has a combiner for combining the first and the second loudness measures to obtain a measure for the perceived level of reverberation.

19 Claims, 12 Drawing Sheets

Related U.S. Application Data

(60) Provisional application No. 61/448,444, filed on Mar. 2, 2011.

(51) Int. Cl.
*H04S 5/00* (2006.01)
*H04S 7/00* (2006.01)
*H04R 29/00* (2006.01)

(52) U.S. Cl.
CPC ....... *H04S 2400/13* (2013.01); *H04S 2420/07* (2013.01)

(56) References Cited

U.S. PATENT DOCUMENTS

| | | | | |
|---|---|---|---|---|
| 2007/0256544 | A1 | 11/2007 | Yamada et al. | |
| 2008/0069366 | A1* | 3/2008 | Soulodre .................. | G01H 7/00 381/63 |
| 2008/0232603 | A1* | 9/2008 | Soulodre .................. | G01H 7/00 381/63 |
| 2008/0267413 | A1 | 10/2008 | Faller | |
| 2011/0164756 | A1 | 7/2011 | Baumgarte et al. | |
| 2012/0057710 | A1 | 3/2012 | Disch et al. | |

FOREIGN PATENT DOCUMENTS

| | | | |
|---|---|---|---|
| EP | 2154911 | A1 | 2/2010 |
| JP | 2007271686 | A | 10/2007 |
| RU | 2330390 | C2 | 7/2008 |
| WO | WO-2006022248 | A1 | 3/2006 |
| WO | 2009039897 | A1 | 4/2009 |
| WO | 2010070016 | A1 | 6/2010 |

OTHER PUBLICATIONS

Bradter, C. et al., "Loudness calculation for individual acoustical objects within complex temporally variable sounds", AES Convention Paper 7494, Presented at the 124th Convention, Amsterdam, The Netherlands, May 17-20, 2008, 12 pages.

Czyzewski, et al., "A Method of Artificial Reverberation Quality Testing", Journal of the Audio Engineering Society, vol. 38, No. 3, Mar. 1990, pp. 129-141.

Gardner, W. et al., "Reverberation Level Matching Experiments", In the Proceedings of the Sabine Centennial Symposium, Acoust. Soc. of Am., Jun. 1994, 15 pages.

Glasberg, B. et al., "Development and Evaluation of a Model for Predicting the Audibility of Time-Varying Sounds in the Presence of Background Sounds", J. Audio Eng. Soc., vol. 53, No. 10, Oct. 2005, pp. 906-918.

Griesinger, D., "Further Investigation Into the Loudness of Running Reverberation", Proceedings of the Institute of Acoustics (UK) Conference, May 1995, 9 pages.

Griesinger, D. , "How Loud is My Reverberation", Presented at the 98th Convention, Paris, France, Feb. 25-28, 1995, 13 pages.

Griesinger, D. , "The importance of the direct to reverberant ratio in the perception of distance, localization, clarity, and envelopment", AES Convention Paper 7724, Presented at the 126the Convention, May 7-10, 2009, 13 pages.

Hase, S. et al., "Reverberance of an Existing Hall in Relation to Both Subsequent Reverberation Time and SPL", Journal of Sound and Vibration, vol. 232, No. 1, Apr. 2000, pp. 149-155.

Lee, D. et al., "Effect of listening level and background noise on the subjective decay rate of room impulse responses: Using time-varying loudness to model reverberance", Applied Acoustics, vol. 71, May 20, 2010, pp. 801-811.

Lee, D. et al., "Equal reverberance matching of music", Proceedings of Acoustics 2009, Adelaide Australia, pp. 23-25, 2009, 6 pages.

Lee, D. , "Equal reverberance matching of running musical stimuli having various reverberation times and SPLs", Proceedings of the 20th Int'l Congress on Acoustics, Sydney, Australia, Aug. 23-27, 2010, 5 pages.

Moore, B. et al., "A Model for the Prediction of Thresholds, Loudness, and Partial Loudness", Journal of the Audio Engineering Society, vol. 45, No. 4, Apr. 1997, pp. 224-232.

Moorer, J. , "About This Reverberation Business", Computer Music Journal, vol. 3, No. 2, Jun. 1979, pp. 13-28.

Paulus, J. , "Perceived Level of Late Reverberation in Speech and Music", AES Convention Paper, Presented at the 130th Convention, London, UK, May 13-16, 2011, 12 pages.

Scharf, B. , "Fundamentals of Auditory Masking", Audiology, vol. 10; presented at the Round Table on Auditory Masking at the Tenth International Congress of Audiology in Dallas, Texas., Oct. 14, 1970, pp. 30-40.

Tsilfidis, et al., "Blind single-channel suppression of late reverberation based on perceptual reverberation modeling", J. Acoust. Soc. Am., vol. 129 (3), Mar. 2011, pp. 1439-1451.

Uhle, C. et al., "Ambience Separation from Mono recordings using Non-negative Matrix Factorization", AES 30th Int'l Conference, Saariselka, Finland, Mar. 15-17, 2007, 8 pages.

Verhey, J. et al., "Einfluss der Zeitstruktur des Hintergrundes auf die Tonhaltigkeit und Lautheit des tonalen Vordergrundes", In Proceedings of DAGA 2010, Berlin, Germany, Mar. 15-18, 2010, pp. 595-596.

* cited by examiner

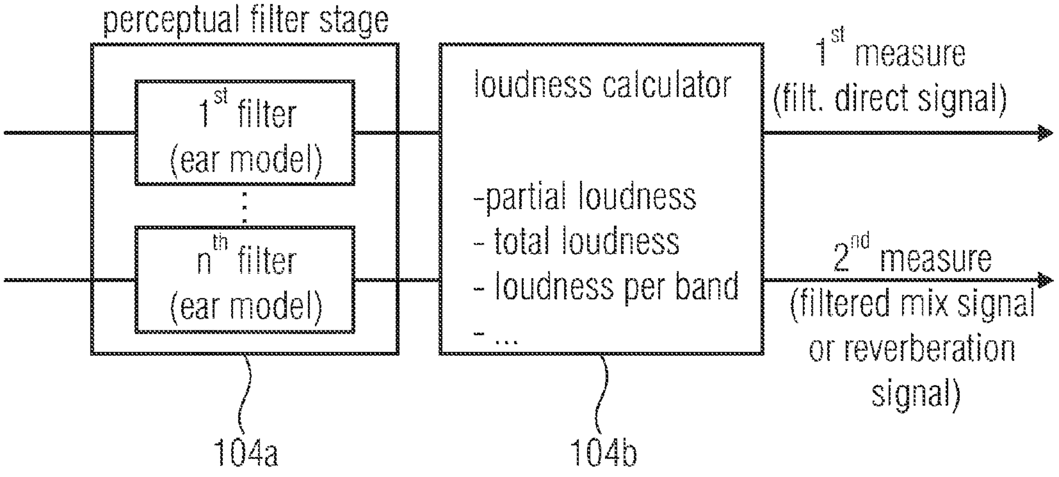
FIG 2A
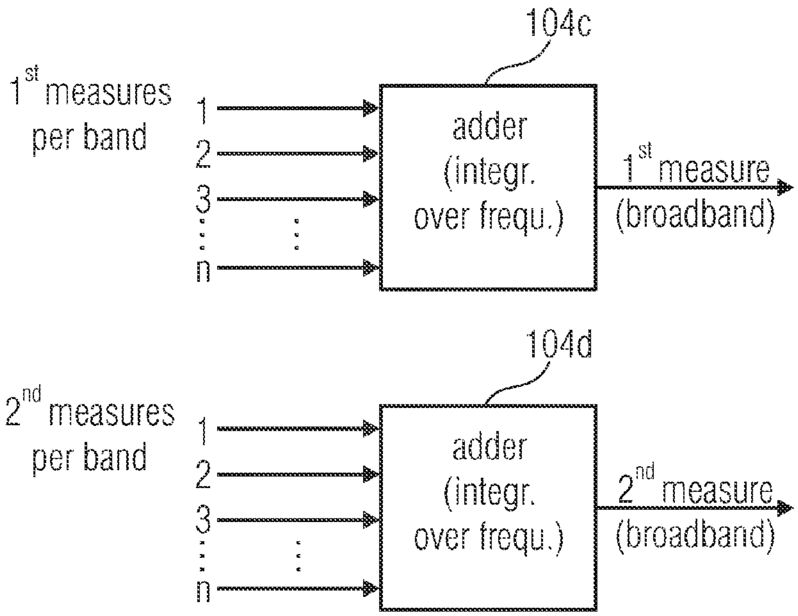
FIG 2B
| | model | $EST_1$ | $EST_2$ | measure |
|---|---|---|---|---|
| 1 | partial | r, x | x, r | $N_{r,x}-N_{x,r}$ |
| 2 | total | m | x | $N_m-N_x$ |
| 3 | total | r | m | $N_r-N_m$ |
| 4 | total | r | x | $N_r-N_x$ |
FIG 2C EXAMPLE OF TIME SIGNAL ENVELOPES OF AN AUDIO SIGNAL (SOLID LINE), THE REVERBERATION SIGNAL (DASHED LINE), AND THE MIXTURE OF BOTH SIGNALS (DOTTED LINE).

LOUDNESS AND PARTIAL LOUDNESS OF THE EXAMPLE SIGNAL: TOTAL LOUDNESS (DOTTED LINE), PARTIAL LOUDNESS OF DIRECT SIGNAL (SOLID LINE) AND OF THE REVERBERATION SIGNAL (DASHED LINE).

(A) TRAINING DATA A, ALL ITEMS.

(B) A SUBSET OF THE TRAINING DATA.

(A) TRAINING DATA A.
SYMBOLS DENOTE DIRECT SIGNALS.

(B) TEST DATA B.
SYMBOLS DENOTE MONO AND STEREO RIPS.

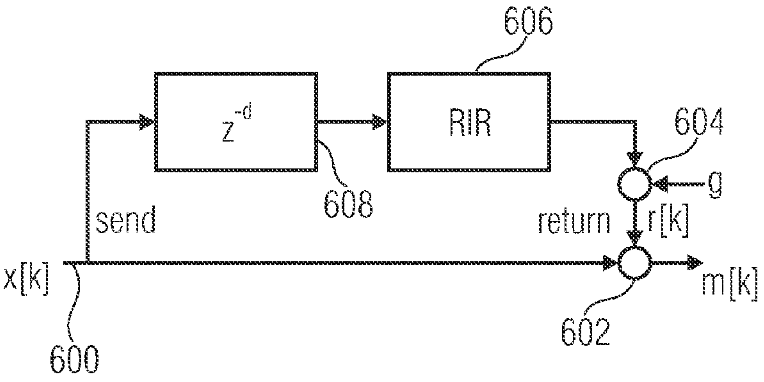
FIG 6
| | r | MAE | RMSE |
|---|---|---|---|
| $\hat{R}_b$, T | 0.76 | 9.7 | 12.1 |
| $\hat{R}_b$, V | 0.76 | 10.4 | 12.6 |
| $\hat{R}_c$, T | 0.85 | 8.3 | 10.0 |
| $\hat{R}_c$, V | 0.85 | 8.3 | 10.6 |
TABLE 1. EVALUATION METRICS OF THE PREDICTION OF $\hat{R}_b$ AND $\hat{R}_c$ FOR TRAINING (T) AND TESTING (V).
FIG 7A
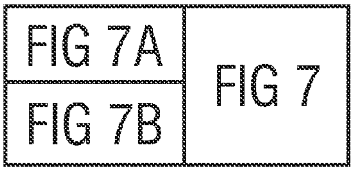

| | r | MAE | RMSE |
|---|---|---|---|
| $\Delta N_{m-x}$, T | 0.81 | 9.0 | 11.2 |
| $\Delta N_{m-x}$, V | 0.81 | 9.0 | 11.1 |
| $\Delta N_{r-m}$, T | 0.80 | 9.5 | 11.3 |
| $\Delta N_{r-m}$, V | 0.80 | 10.1 | 12.7 |
| $\Delta N_{r-x}$, T | 0.83 | 8.8 | 10.5 |
| $\Delta N_{r-x}$, V | 0.83 | 9.1 | 11.1 |

TABLE 2. EVALUATION METRICS OBTAINED WHEN USING THE TOTAL LOUDNESS OF SEPARATED SIGNALS AMD MIXTURE SIGNAL, FOR TRAINING (T) AND TESTING (V). SEE EQUATIONS (5)-(7) FOR AN EXPLANATION OF THE LOUDNESS FEATURES.

| | r | MAE | RMSE |
|---|---|---|---|
| no spreading, T | 0.84 | 8.4 | 10.1 |
| no spreading, V | 0.84 | 8.8 | 10.6 |
| fixed spread., T | 0.85 | 8.3 | 10.1 |
| fixed spread., V | 0.85 | 8.7 | 10.7 |

TABLE 3. EVALUATION METRICS FOR LOUDNESS FEATURES WITHOUT SPREADING AND WITH LEVEL-INVARIANT SPREADING, FOR TRAINING (T) AND (V).

| FIG 7A | FIG 7 |
|---|---|
| FIG 7B | |

FIG 7B

"SIG" corresponds to e.g. direct signal
"NOISE" corresponds to e.g. reverber. signal or mix signal $$
\begin{aligned}
N'_{SIG} = {} & C\{[(E_{SIG} + E_{NOISE})G + A]^{\alpha} - A^{\alpha}\} \\
& - C\{[(E_{NOISE}(1+K) + E_{THRQ})G + A]^{\alpha} \\
& - (E_{THRQ}G + A)^{\alpha}\}\left(\frac{E_{THRN}}{E_{SIG}}\right)^{0.3}
\end{aligned} \qquad (17)
$$

$$
\begin{aligned}
N'_{SIG} = {} & C\left(\frac{2E_{SIG}}{E_{SIG} + E_{THRN}}\right)^{1.5}\left\{\frac{(E_{THRQ}G + A)^{\alpha} - A^{\alpha}}{[(E_{NOISE}(1+K) + E_{THRQ})G + A]^{\alpha} - (E_{NOISE}G + A)^{\alpha}}\right\} \\
& \times\{[(E_{SIG} + E_{NOISE})G + A]^{\alpha} - (E_{NOISE}G + A)^{\alpha}\}.
\end{aligned} \qquad (18)
$$

$$
\begin{aligned}
N'_{SIG} = {} & C_2(E_{SIG} + E_{NOISE})^{0.5} \\
& - C_2\{[(1+K)E_{NOISE} + E_{THRQ}]^{0.5} \\
& - (E_{THRQ}G + A)^{\alpha} + A^{\alpha}\}\left(\frac{E_{THRN}}{E_{SIG}}\right)^{0.3}
\end{aligned} \qquad (19)
$$

$$
\begin{aligned}
N'_{SIG} = {} & C\left(\frac{2E_{SIG}}{E_{SIG} + E_{THRN}}\right)^{1.5}\left\{\frac{(E_{THRQ}G + A)^{\alpha} - A^{\alpha}}{[(E_{NOISE}(1+K) + E_{THRQ})^{0.5} - (E_{NOISE})^{0.5}}\right\} \\
& \times[(E_{SIG} + E_{NOISE})^{0.5} - (E_{NOISE})^{0.5}].
\end{aligned} \qquad (20)
$$

EQUATIONS (17) TO (20) FROM B.C.J. MOORE, B.R. GLASBERG, T. BAER, "A MODEL FOR THE PREDICTION OF THRESHOLDS, LOUDNESS AND PARTIAL LOUDNESS", J. AUDIO ENG. SOC., VOL. 45, NO. 4, APRIL 1997.

FIG 10

APPARATUS AND METHOD FOR DETERMINING A MEASURE FOR A PERCEIVED LEVEL OF REVERBERATION, AUDIO PROCESSOR AND METHOD FOR PROCESSING A SIGNAL

CROSS-REFERENCE TO RELATED APPLICATIONS

This application is a continuation of copending International Application No. PCT/EP2012/053193, filed Feb. 24, 2012, which is incorporated herein by reference in its entirety, and additionally claims priority from U.S. application Ser. No. 61/448,444, filed Mar. 2, 2011 and European Application No. 11171488.7, filed Jun. 27, 2011, all of which are incorporated herein by reference in their entirety.

BACKGROUND OF THE INVENTION

The present application is related to audio signal processing and, particularly, to audio processing usable in artificial reverberators.

The determination of a measure for a perceived level of reverberation is, for example, desired for applications where an artificial reverberation processor is operated in an automated way and needs to adapt its parameters to the input signal such that the perceived level of the reverberation matches a target value. It is noted that the term reverberance while alluding to the same theme, does not appear to have a commonly accepted definition which makes it difficult to use as a quantitative measure in a listening test and prediction scenario.

Artificial reverberation processors are often implemented as linear time-invariant systems and operated in a send-return signal path, as depicted in FIG. 6, with pre-delay d, reverberation impulse response (RIR) and a scaling factor g for controlling the direct-to-reverberation ratio (DRR). When implemented as parametric reverberation processors, they feature a variety of parameters, e.g. for controlling the shape and the density of the RIR, and the inter-channel coherence (ICC) of the RIRs for multi-channel processors in one or more frequency bands.

FIG. 6 shows a direct signal x[k] input at an input 600, and this signal is forwarded to an adder 602 for adding this signal to a reverberation signal component r[k] output from a weighter 604, which receives, at its first input, a signal output by a reverberation filter 606 and which receives, at its second input, a gain factor g. The reverberation filter 606 may have an optional delay stage 608 connected upstream of the reverberation filter 606, but due to the fact that the reverberation filter 606 will include some delay by itself, the delay in block 608 can be included in the reverberation filter 606 so that the upper branch in FIG. 6 can only comprise a single filter incorporating the delay and the reverberation or only incorporate the reverberation without any additional delay. A reverberation signal component is output by the filter 606 and this reverberation signal component can be modified by the multiplier 606 in response to the gain factor g in order to obtain the manipulated reverberation signal component r[k] which is then combined with the direct signal component input at 600 in order to finally obtain the mix signal m[k] at the output of the adder 602. It is noted that the term "reverberation filter" refers to common implementations of artificial reverberations (either as convolution which is equivalent to FIR filtering, or as implementations using recursive structures, such as Feedback Delay Networks or networks of allpass filters and feedback comb filters or other recursive filters), but designates a general processing which produces a reverberant signal. Such processings may involve non-linear processes or time varying processes such as low-frequent modulations of signal amplitudes or delay lengths. In these cases the term "reverberation filter" would not apply in a strict technical sense of an Linear Time Invariant (LTI) system. In fact, the "reverberation filter" refers to a processing which outputs a reverberant signal, possibly including a mechanism for reading a computed or recorded reverberant signal from memory.

These parameters have an impact on the resulting audio signal in terms of perceived level, distance, room size, coloration and sound quality. Furthermore, the perceived characteristics of the reverberation depend on the temporal and spectral characteristics of the input signal [1]. Focusing on a very important sensation, namely loudness, it can be observed that the loudness of the perceived reverberation is monotonically related to the non-stationarity of the input signal. Intuitively speaking, an audio signal with large variations in its envelope excites the reverberation at high levels and allows it to become audible at lower levels. In a typical scenario where the long-term DRR expressed in decibels is positive, the direct signal can mask the reverberation signal almost completely at time instances where its energy envelope increases. On the other hand, whenever the signal ends, the previously excited reverberation tail becomes apparent in gaps exceeding a minimum duration determined by the slope of the post-masking (at maximum 200 ms) and the integration time of the auditory system (at maximum 200 ms for moderate levels).

To illustrate this, FIG. 4*a* shows the time signal envelopes of a synthetic audio signal and of an artificially generated reverberation signal, and FIG. 4*b* shows predicted loudness and partial loudness functions computed with a computational model of loudness. An RIR with a short pre-delay of 50 ms is used here, omitting early reflections and synthesizing the late part of the reverberation with exponentially decaying white noise [2]. The input signal has been generated from a harmonic wide-band signal and an envelope function such that one event with a short decay and a second event with a long decay are perceived. While the long event produces more total reverberation energy, it comes to no surprise that it is the short sound which is perceived as being more reverberant. Where the decaying slope of the longer event masks the reverberation, the short sound already disappeared before the reverberation has built up and thereby a gap is open in which the reverberation is perceived. Please note that the definition of masking used here includes both complete and partial masking [3].

Although such observations have been made many times [4, 5, 6], it is still worth emphasizing them because it illustrates qualitatively why models of partial loudness can be applied in the context of this work. In fact, it has been pointed out that the perception of reverberation arises from stream segregation processes in the auditory system [4, 5, 6] and is influenced by the partial masking of the reverberation due to the direct sound.

The considerations above motivate the use of loudness models. Related investigations were performed by Lee et al. and focus on the prediction of the subjective decay rate of RIRs when listening to them directly [7] and on the effect of the playback level on reverberance [8]. A predictor for reverberance using loudness-based early decay times is proposed in [9]. In contrast to this work, the prediction methods proposed here process the direct signal and the reverberation signal with a computational model of partial loudness (and with simplified versions of it in the quest for low-complexity implementations) and thereby consider the influence of the input (direct) signal on the sensation. Recently, Tsilfidis and Mourjopoulus [10] investigated the use of a loudness model for the suppression of the late reverberation in single-channel recordings. An estimate of the direct signal is computed from the reverberant input signal using a spectral subtraction method, and a reverberation masking index is derived by means of a computational auditory masking model, which controls the reverberation processing.

It is a feature of a multi-channel synthesizers and other devices to add reverberation in order to make the sound better from a perceptual point of view. On the other hand, the generated reverberation is an artificial signal which when added to the signal at to low level is barely audible and when added at to high level leads to unnatural and unpleasant sounding final mixed signal. What makes things even worse is that, as discussed in the context of FIGS. 4*a* and 4*b* that the perceived level of reverberation is strongly signal-dependent and, therefore, a certain reverberation filter might work very well for one kind of signals, but may have no audible effect or, even worse, can generate serious audible artifacts for a different kind of signals.

An additional problem related to reverberation is that the reverberated signal is intended for the ear of an entity or individual, such as a human being and the final goal of generating a mix signal having a direct signal component and a reverberation signal component is that the entity perceives this mixed signal or "reverberated signal" as sounding well or as sounding natural. However, the auditory perception mechanism or the mechanism how sound is actually perceived by an individual is strongly non-linear, not only with respect to the bands in which the human hearing works, but also with respect to the processing of signals within the bands. Additionally, it is known that the human perception of sound is not so much directed by the sound pressure level which can be calculated by, for example, squaring digital samples, but the perception is more controlled by a sense of loudness. Additionally, for mixed signals, which include a direct component and a reverberation signal component, the sensation of the loudness of the reverberation component depends not only on the kind of direct signal component, but also on the level or loudness of the direct signal component.

Therefore, there exists a need for determining a measure for a perceived level of reverberation in a signal consisting of a direct signal component and a reverberation signal component in order to cope with the above problems related with the auditory perception mechanism of an entity.

SUMMARY

According to an embodiment, an apparatus for determining a measure for a perceived level of reverberation in a mix signal having a direct signal component and a reverberation signal component may have a loudness model processor having a perceptual filter stage for filtering the dry signal component, the reverberation signal component or the mix signal, wherein the perceptual filter stage is configured for modeling an auditory perception mechanism of an entity to acquire a filtered direct signal, a filtered reverberation signal or a filtered mix signal; a loudness estimator for estimating a first loudness measure using the filtered direct signal and for estimating a second loudness measure using the filtered reverberation signal or the filtered mix signal, where the filtered mix signal is derived from a superposition of the direct signal component and the reverberation signal component; and a combiner for combining the first and the second loudness measures to acquire a measure for the perceived level of reverberation.

According to another embodiment, a method of determining a measure for a perceived level of reverberation in a mix signal having a direct signal component and a reverberation signal component may have the steps of filtering the dry signal component, the reverberation signal component or the mix signal, wherein the filtering is performed using a perceptual filter stage being configured for modeling an auditory perception mechanism of an entity to acquire a filtered direct signal, a filtered reverberation signal or a filtered mix signal; estimating a first loudness measure using the filtered direct signal; estimating a second loudness measure using the filtered reverberation signal or the filtered mix signal, where the filtered mix signal is derived from a superposition of the direct signal component and the reverberation signal component; and combining the first and the second loudness measures to acquire a measure for the perceived level of reverberation.

According to another embodiment, an audio processor for generating a reverberated signal from a direct signal component may have a reverberator for reverberating the direct signal component to acquire a reverberated signal component; an apparatus for determining a measure for a perceived level of reverberation in the reverberated signal having the direct signal component and the reverberated signal component which may have a loudness model processor having a perceptual filter stage for filtering the dry signal component, the reverberation signal component or the mix signal, wherein the perceptual filter stage is configured for modeling an auditory perception mechanism of an entity to acquire a filtered direct signal, a filtered reverberation signal or a filtered mix signal; a loudness estimator for estimating a first loudness measure using the filtered direct signal and for estimating a second loudness measure using the filtered reverberation signal or the filtered mix signal, where the filtered mix signal is derived from a superposition of the direct signal component and the reverberation signal component; and a combiner for combining the first and the second loudness measures to acquire a measure for the perceived level of reverberation; a controller for receiving the perceived level generated by the apparatus for determining a measure of a perceived level of reverberation, and for generating a control signal in accordance with the perceived level and a target value; a manipulator for manipulating the dry signal component or the reverberation signal component in accordance with the control value; and a combiner for combining the manipulated dry signal component and the manipulated reverberation signal component, or for combining the dry signal component and the manipulated reverberation signal component, or for combining the manipulated dry signal component and the reverberation signal component to acquire the mix signal.

According to another embodiment, a method of processing an audio signal for generating a reverberated signal from a direct signal component may have the steps of reverberating the direct signal component to acquire a reverberated signal component; a method of determining a measure for a perceived level of reverberation in the reverberated signal having the direct signal component and the reverberated signal component which may have the steps of filtering the dry signal component, the reverberation signal component or the mix signal, wherein the filtering is performed using a perceptual filter stage being configured for modeling an auditory perception mechanism of an entity to acquire a filtered direct signal, a filtered reverberation signal or a filtered mix signal; estimating a first loudness measure using the filtered direct signal; estimating a second loudness measure using the filtered reverberation signal or the filtered mix signal, where the filtered mix signal is derived from a superposition of the direct signal component and the reverberation signal component; and combining the first and the second loudness measures to acquire a measure for the perceived level of reverberation; receiving the perceived level generated by the method for determining a measure of a perceived level of reverberation, generating a control signal in accordance with the perceived level and a target value; manipulating the dry signal component or the reverberation signal component in accordance with the control value; and combining the manipulated dry signal component and the manipulated reverberation signal component, or combining the dry signal component and the manipulated reverberation signal component, or combining the manipulated dry signal component and the reverberation signal component to acquire the mix signal.

According to another embodiment, a computer program may have a program code for performing, when running on a computer, the method of determining a measure for a perceived level of reverberation in a mix signal having a direct signal component and a reverberation signal component which may have the steps of filtering the dry signal component, the reverberation signal component or the mix signal, wherein the filtering is performed using a perceptual filter stage being configured for modeling an auditory perception mechanism of an entity to acquire a filtered direct signal, a filtered reverberation signal or a filtered mix signal; estimating a first loudness measure using the filtered direct signal; estimating a second loudness measure using the filtered reverberation signal or the filtered mix signal, where the filtered mix signal is derived from a superposition of the direct signal component and the reverberation signal component; and combining the first and the second loudness measures to acquire a measure for the perceived level of reverberation.

According to another embodiment, a computer program may have a program code for performing, when running on a computer, the method of processing an audio signal for generating a reverberated signal from a direct signal component which may have the steps of reverberating the direct signal component to acquire a reverberated signal component; a method of determining a measure for a perceived level of reverberation in the reverberated signal having the direct signal component and the reverberated signal component which may have the steps of filtering the dry signal component, the reverberation signal component or the mix signal, wherein the filtering is performed using a perceptual filter stage being configured for modeling an auditory perception mechanism of an entity to acquire a filtered direct signal, a filtered reverberation signal or a filtered mix signal; estimating a first loudness measure using the filtered direct signal; estimating a second loudness measure using the filtered reverberation signal or the filtered mix signal, where the filtered mix signal is derived from a superposition of the direct signal component and the reverberation signal component; and combining the first and the second loudness measures to acquire a measure for the perceived level of reverberation; receiving the perceived level generated by the method for determining a measure of a perceived level of reverberation, generating a control signal in accordance with the perceived level and a target value; manipulating the dry signal component or the reverberation signal component in accordance with the control value; and combining the manipulated dry signal component and the manipulated reverberation signal component, or combining the dry signal component and the manipulated reverberation signal component, or combining the manipulated dry signal component and the reverberation signal component to acquire the mix signal.

The present invention is based on the finding that the measure for a perceived level of reverberation in a signal is determined by a loudness model processor comprising a perceptual filter stage for filtering a direct signal component, a reverberation signal component or a mix signal component using a perceptual filter in order to model an auditory perception mechanism of an entity. Based on the perceptually filtered signals, a loudness estimator estimates a first loudness measure using the filtered direct signal and a second loudness measure using the filtered reverberation signal or the filtered mix signal. Then, a combiner combines the first measure and the second measure to obtain a measure for the perceived level of reverberation. Particularly, a way of combining two different loudness measures advantageously by calculating difference provides a quantitative value or a measure of how strong a sensation of the reverberation is compared to the sensation of the direct signal or the mix signal.

For calculating the loudness measures, the absolute loudness measures can be used and, particularly, the absolute loudness measures of the direct signal, the mixed signal or the reverberation signal. Alternatively, the partial loudness can also be calculated where the first loudness measure is determined by using the direct signal as the stimulus and the reverberation signal as noise in the loudness model and the second loudness measure is calculated by using the reverberation signal as the stimulus and the direct signal as the noise. Particularly, by combining these two measures in the combiner, a useful measure for a perceived level of reverberation is obtained. It has been found out by the inventors that such useful measure cannot be determined alone by generating a single loudness measure, for example, by using the direct signal alone or the mix signal alone or the reverberation signal alone. Instead, due to the inter-dependencies in human hearing, combining measures which are derived differently from either of these three signals, the perceived level of reverberation in a signal can be determined or modeled with a high degree of accuracy.

Advantageously, the loudness model processor provides a time/frequency conversion and acknowledges the ear transfer function together with the excitation pattern actually occurring in human hearing an modeled by hearing models.

In an embodiment, the measure for the perceived level of reverberation is forwarded to a predictor which actually provides the perceived level of reverberation in a useful scale such as the Sone-scale. This predictor is advantageously trained by listening test data and the predictor parameters for a linear predictor comprise a constant term and a scaling factor. The constant term advantageously depends on the characteristic of the actually used reverberation filter and, in one embodiment of the reverberation filter characteristic parameter $T_{60}$, which can be given for straightforward well-known reverberation filters used in artificial reverberators. Even when, however, this characteristic is not known, for example, when the reverberation signal component is not separately available, but has been separated from the mix signal before processing in the inventive apparatus, an estimation for the constant term can be derived.

BRIEF DESCRIPTION OF THE DRAWINGS

Subsequently, embodiments of the present invention are described with respect to the accompanying drawings, in which:

FIG. 2*a* is an illustration of an embodiment of the loudness model processor;

FIG. 2*b* illustrates a further implementation of the loudness model processor;

FIG. 2*c* illustrates four modes of calculating the measure for the perceived level of reverberation;

FIG. 6 illustrates a block diagram of an artificial reverberation processor;

FIGS. 7A and 7B illustrates three tables for indicating evaluation metrics for embodiments of the invention;

FIG. 10 illustrates the equations from the Moore Glasberg, Baer publication of 1997 used in an embodiment for calculating the specific loudness.

DETAILED DESCRIPTION OF THE INVENTION

The perceived level of reverberation depends on both the input audio signal and the impulse response. Embodiments of the invention aim at quantifying this observation and predicting the perceived level of late reverberation based on separate signal paths of direct and reverberant signals, as they appear in digital audio effects. An approach to the problem is developed and subsequently extended by considering the impact of the reverberation time on the prediction result. This leads to a linear regression model with two input variables which is able to predict the perceived level with high accuracy, as shown on experimental data derived from listening tests. Variations of this model with different degrees of sophistication and computational complexity are compared regarding their accuracy. Applications include the control of digital audio effects for automatic mixing of audio signals.

Embodiments of the present invention are not only useful for predicting the perceived level of reverberation in speech and music when the direct signal and the reverberation impulse response (RIR) are separately available. In other embodiments, in which a reverberated signal occurs, the present invention can be applied as well. In this instance, however, a direct/ambience or direct/reverberation separator would be included to separate the direct signal component and the reverberated signal component from the mix signal. Such an audio processor would then be useful to change the direct/reverberation ratio in this signal in order to generate a better sounding reverberated signal or better sounding mix signal.

Figure 1:
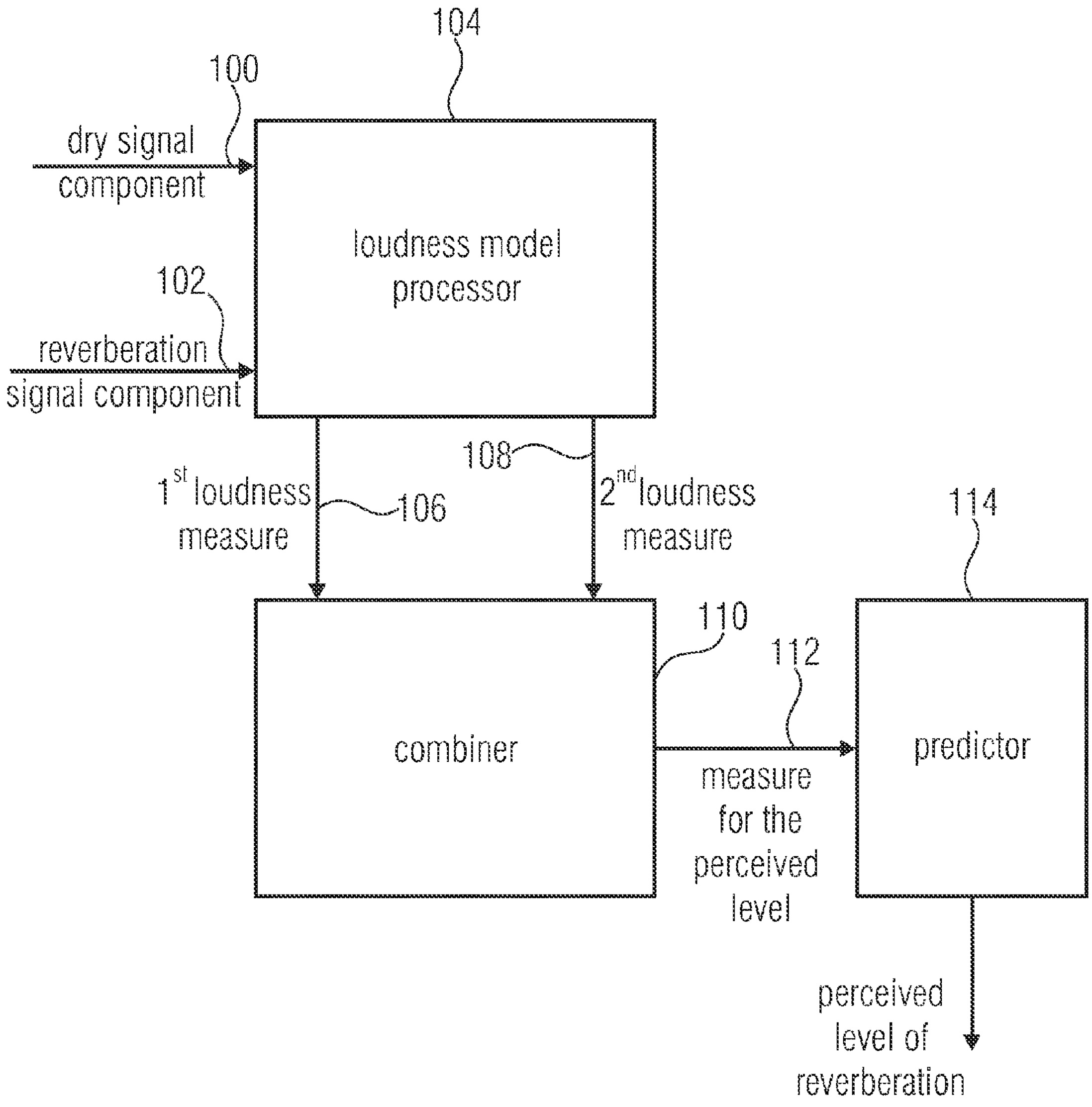
FIG. 1 is a block diagram for an apparatus or method for determining a measure for a perceived level of reverberation.

FIG. 1 illustrates an apparatus for determining a measure for a perceived level of reverberation in a mix signal comprising a direct signal component or dry signal component 100 and a reverberation signal component 102. The dry signal component 100 and the reverberation signal component 102 are input into a loudness model processor 104. The loudness model processor is configured for receiving the direct signal component 100 and the reverberation signal component 102 and is furthermore comprising a perceptual filter stage 104*a* and a subsequently connected loudness calculator 104*b* as illustrated in FIG. 2*a*. The loudness model processor generates, at its output, a first loudness measure 106 and a second loudness measure 108. Both loudness measures are input into a combiner 110 for combining the first loudness measure 106 and the second loudness measure 108 to finally obtain a measure 112 for the perceived level of reverberation. Depending on the implementation, the measure for the perceived level 112 can be input into a predictor 114 for predicting the perceived level of reverberation based on an average value of at least two measures for the perceived loudness for different signal frames as will be discussed in the context of FIG. 9. However, the predictor 114 in FIG. 1 is optional and actually transforms the measure for the perceived level into a certain value range or unit range such as the Sone-unit range which is useful for giving quantitative values related to loudness. However, other usages for the measure for the perceived level 112 which is not processed by the predictor 114 can be used as well, for example, in the audio processor of FIG. 8, which does not necessarily have to rely on a value output by the predictor 114, but which can also directly process the measure for the perceived level 112, either in a direct form or advantageously in a kind of a smoothed form where smoothing over time is advantageous in order to not have strongly changing level corrections of the reverberated signal or, as discussed later on, of the gain factor g illustrated in FIG. 6 or illustrated in FIG. 8.

Particularly, the perceptual filter stage is configured for filtering the direct signal component, the reverberation signal component or the mix signal component, wherein the perceptual filter stage is configured for modeling an auditory perception mechanism of an entity such as a human being to obtain a filtered direct signal, a filtered reverberation signal or a filtered mix signal. Depending on the implementation, the perceptual filter stage may comprise two filters operating in parallel or can comprise a storage and a single filter since one and the same filter can actually be used for filtering each of the three signals, i.e., the reverberation signal, the mix signal and the direct signal. In this context, however, it is to be noted that, although FIG. 2*a* illustrates n filters modeling the auditory perception mechanism, actually two filters will be enough or a single filter filtering two signals out of the group comprising the reverberation signal component, the mix signal component and the direct signal component.

The loudness calculator 104*b* or loudness estimator is configured for estimating the first loudness-related measure using the filtered direct signal and for estimating the second loudness measure using the filtered reverberation signal or the filtered mix signal, where the mix signal is derived from a super position of the direct signal component and the reverberation signal component.

FIG. 2*c* illustrates four modes of calculating the measure for the perceived level of reverberation. Embodiment 1 relies on the partial loudness where both, the direct signal component x and the reverberation signal component r are used in the loudness model processor, but where, in order to determine the first measure EST1, the reverberation signal is used as the stimulus and the direct signal is used as the noise. For determining the second loudness measure EST2, the situation is changed, and the direct signal component is used as a stimulus and the reverberation signal component is used as the noise. Then, the measure for the perceived level of correction generated by the combiner is a difference between the first loudness measure EST1 and the second loudness measure EST2.

However, other computationally efficient embodiments additionally exist which are indicated at lines 2, 3, and 4 in FIG. 2c. These more computationally efficient measures rely on calculating the total loudness of three signals comprising the mix signal m, the direct signal x and the reverberation signal n. Depending on the needed calculation performed by the combiner indicated in the last column of FIG. 2c, the first loudness measure EST1 is the total loudness of the mix signal or the reverberation signal and the second loudness measure EST2 is the total loudness of the direct signal component x or the mix signal component m, where the actual combinations are as illustrated in FIG. 2c.

Figure 3:
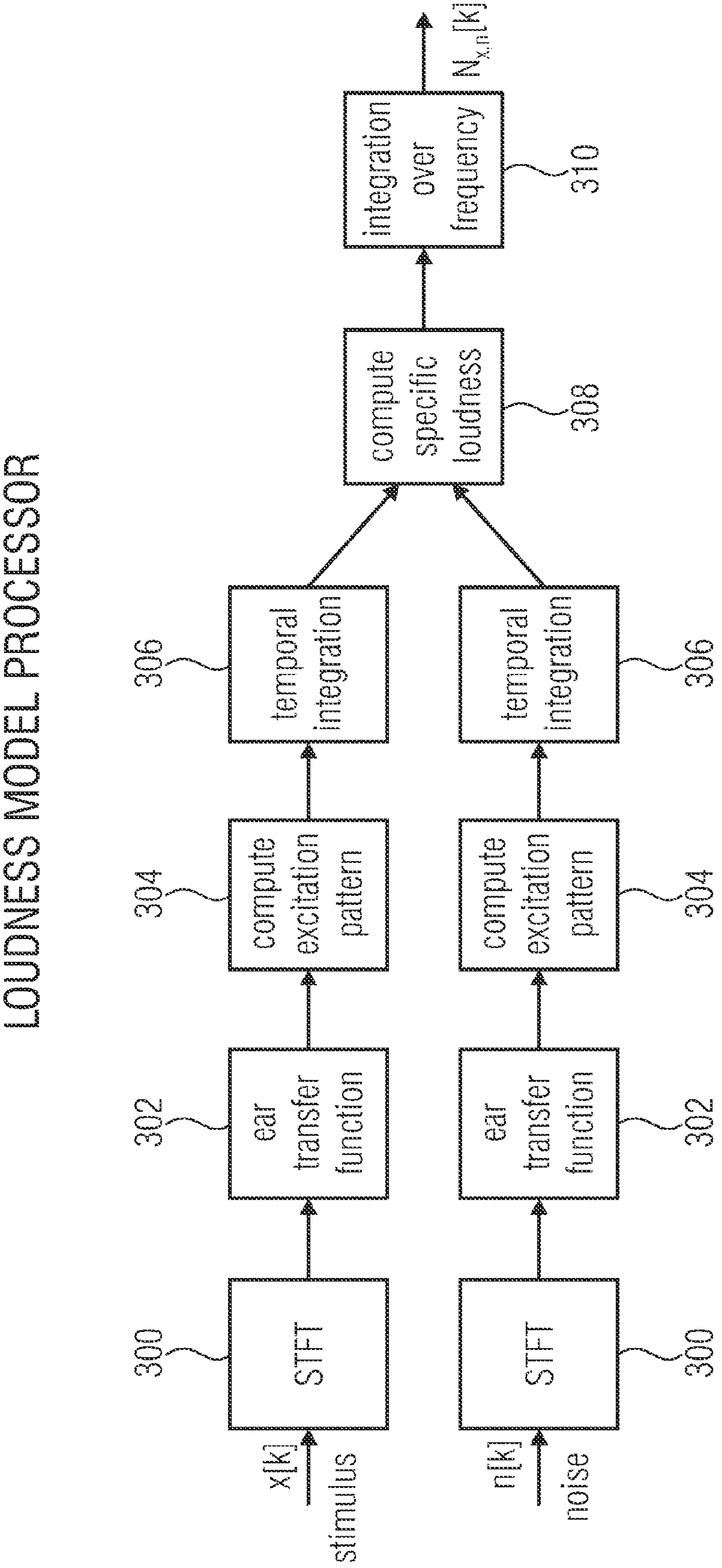
FIG. 3 illustrates a further implementation of the loudness model processor.

In a further embodiment, the loudness model processor 104 is operating in the frequency domain as discussed in more detail in FIG. 3. In such a situation, the loudness model processor and, particularly, the loudness calculator 104b provides a first measure and a second measure for each band. These first measures over all n bands are subsequently added or combined together in an adder 104c for the first branch and 104d for the second branch in order to finally obtain a first measure for the broadband signal and a second measure for the broadband signal.

FIG. 3 illustrates the embodiment of the loudness model processor which has already been discussed in some aspects with respect to the FIGS. 1, 2a, 2b, 2c. Particularly, the perceptual filter stage 104a comprises a time-frequency converter 300 for each branch, where, in the FIG. 3 embodiment, x[k] indicates the stimulus and n[k] indicates the noise. The time/frequency converted signal is forwarded into an ear transfer function block 302 (Please note that the ear transfer function can alternatively be computed prior to the time-frequency converter with similar results, but higher computational load) and the output of this block 302 is input into a compute excitation pattern block 304 followed by a temporal integration block 306. Then, in block 308, the specific loudness in this embodiment is calculated, where block 308 corresponds to the loudness calculator block 104b in FIG. 2a. Subsequently, an integration over frequency in block 310 is performed, where block 310 corresponds to the adder already described as 104c and 104d in FIG. 2b. It is to be noted that block 310 generates the first measure for a first set of stimulus and noise and the second measure for a second set of stimulus and noise. Particularly, when FIG. 2b is considered, the stimulus for calculating the first measure is the reverberation signal and the noise is the direct signal while, for calculating the second measure, the situation is changed and the stimulus is the direct signal component and the noise is the reverberation signal component. Hence, for generating two different loudness measures, the procedure illustrated in FIG. 3 has been performed twice. However, changes in the calculation only occur in block 308 which operates differently as discussed furthermore in the context of FIG. 10, so that the steps illustrated by blocks 300 to 306 only have to be performed once, and the result of the temporal integration block 306 can be stored in order to compute the first estimated loudness and the second estimated loudness for embodiment 1 in FIG. 2c. It is to be noted that, for the other embodiments 2, 3, 4 in FIG. 3c, block 308 is replaced by an individual block "compute total loudness" for each branch, where, in this embodiment it is indifferent, whether one signal is considered to be a stimulus or a noise.

Subsequently, the loudness model illustrated in FIG. 3 is discussed in more detail.

The implementation of the loudness model in FIG. 3 follows the descriptions in [11, 12] with modifications as detailed later on. The training and the validation of the prediction uses data from listening tests described in [13] and briefly summarized later. The application of the loudness model for predicting the perceived level of late reverberation is described later on as well. Experimental results follow.

This section describes the implementation of a model of partial loudness, the listening test data that was used as ground truth for the computational prediction of the perceived level of reverberation, and a proposed prediction method which is based on the partial loudness model.

The loudness model computes the partial loudness $N_{x,n}[k]$ of a signal x[k] when presented simultaneously with a masking signal n[k]

$$N_{x,n}[k]=f(x[k],\ n[k]). \tag{1}$$

Figure 4A:
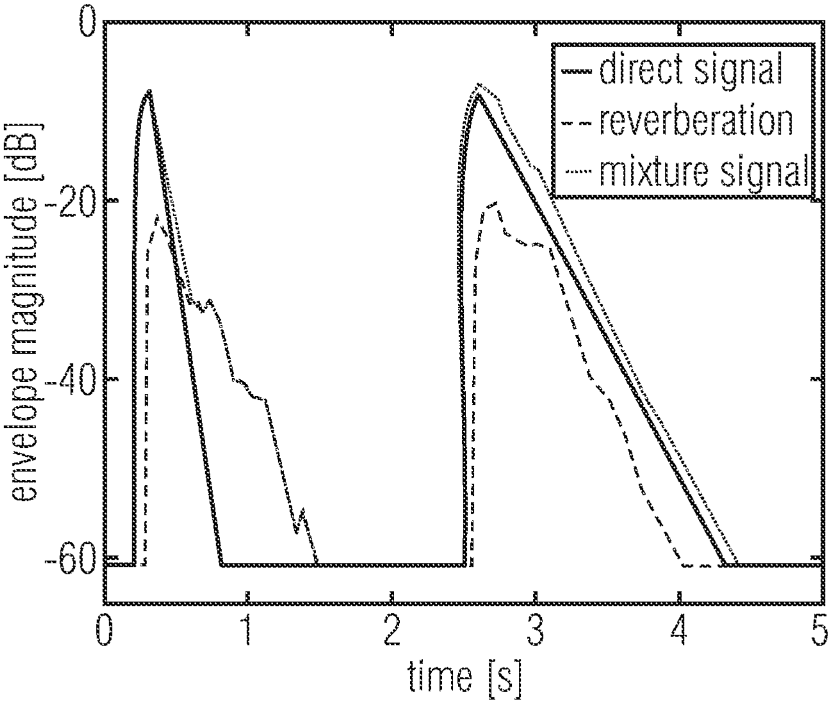
FIG. 4*a,b* illustrate examples of time signal envelopes and a corresponding loudness and partial loudness.
Figure 4B:
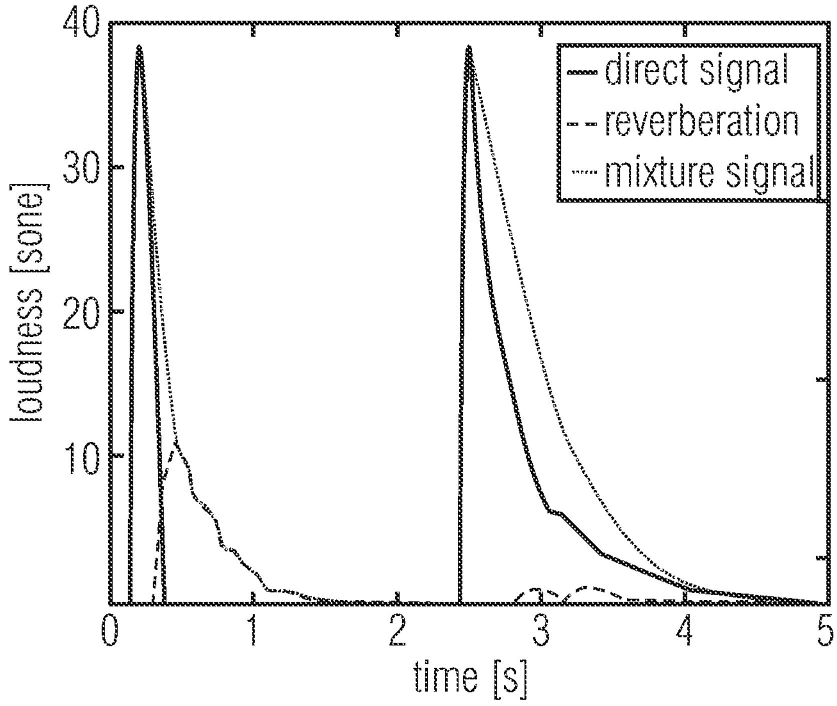

Although early models have dealt with the perception of loudness in steady background noise, some work exists on loudness perception in backgrounds of co-modulated random noise [14], complex environmental sounds [12], and music signals [15]. FIG. 4b illustrates the total loudness and the partial loudness of its components of the example signal shown in FIG. 4a, computed with the loudness model used here.

The model used in this work is similar to the models in [11, 12] which itself drew on earlier research by Fletcher, Munson, Stevens, and Zwicker, with some modifications as described in the following. A block diagram of the loudness model is shown in FIG. 3. The input signals are processed in the frequency domain using a Short-time Fourier transform (STFT). In [12], 6 DFTs of different lengths are used in order to obtain a good match for the frequency resolution and the temporal resolution to that of the human auditory system at all frequencies. In this work, only one DFT length is used for the sake of computational efficiency, with a frame length of 21 ms at a sampling rate of 48 kHz, 50% overlap and a Hann window function. The transfer through the outer and middle ear is simulated with a fixed filter. The excitation function is computed for 40 auditory filter bands spaced on the equivalent rectangular bandwidth (ERB) scale using a level dependent excitation pattern. In addition to the temporal integration due to the windowing of the STFT, a recursive integration is implemented with a time constant of 25 ms, which is only active at times where the excitation signal decays.

The specific partial loudness, i.e., the partial loudness evoked in each of the auditory filter band, is computed from the excitation levels from the signal of interest (the stimulus) and the interfering noise according to Equations (17)-(20) in [11], illustrated in FIG. 10. These equations cover the four cases where the signal is above the hearing threshold in noise or not, and where the excitation of the mixture signal is less than 100 dB or not. If no interfering signal is fed into the model, i.e. n[k]=0, the result equals the total loudness $N_x[k]$ of the stimulus x[k].

Particularly, FIG. 10 illustrates equations 17, 18, 19, 20 of the publication " A Model for the Prediction of Thresholds, Loudness and Partial Loudness", B. C. J. Moore, B. R. Glasberg, T. Baer, J. Audio Eng. Soc., Vol. 45, No. 4, April 1997. This reference describes the case of a signal presented together with a background sound. Although the background may be any type of sound, it is referred to as "noise" in this reference to distinguish it from the signal whose loudness is to be judged. The presence of the noise reduces the loudness of the signal, an effect called partial masking. The loudness of the signal grows very rapidly when its level is increased from a threshold value to a value 20-30 dB above threshold. In the paper it is assumed that the partial loudness of a signal presented in noise can be calculated by summing the partial specific loudness of the signal across frequency (on an ERB-scale). Equations are derived for calculating the partial specific loudness by considering four limiting cases. $E_{SIG}$ denotes the excitation evoked by the signal and $E_{NOISE}$ denotes the excitation evoked by the noise. It is assumed that $E_{SIG}>E_{THRQ}$ and $E_{SIG}$ plus $E_{NOISE}<10^{10}$. The total specific loudness $N'_{TOT}$ is defined as follows:

$$N'_{TOT}=C\{[(E_{SIG}+E_{NOISE})G+A]^{\alpha}-A^{\alpha}\}$$

It is assumed that the listener can partition a specific loudness at a given center frequency between the specific loudness of the signal and that of the noise, but in a way that choses in favor of the total specific loudness.

$$N'_{TOT}=N'_{SIG}+N_{NOISE}.$$

This assumption is consistent, since in most experiments measuring partial masking, the listener hears first the noise alone and then the noise plus signal. The specific loudness for the noise alone, assuming that it is above threshold, is $$N'_{NOISE}=C[(E_{NOISE}G+A)^{\alpha}-A^{\alpha}].$$

Hence, if the specific loudness of the signal were derived simply by subjecting the specific loudness of the noise from the total specific loudness, the result would be $$N'_{SIG}=C\{[(E_{SIG}+E_{NOISE})G+A]^{\alpha}-A^{\alpha}\}-C[(E_{NOISE}G+A)^{\alpha}-A^{\alpha}]$$

In practice, the way that specific loudness is partitioned between signal and noise appears to vary depending on the relative excitation of the signal and the noise.

Four situations are considered that indicate how specific loudness is assigned at different signal levels. Let $E_{THRN}$ denote the peak excitation evoked by a sinusoidal signal when it is at its masked threshold in the background noise. When $E_{SIG}$ is well below $E_{THRN}$, all the specific loudness is assigned to the noise, and the partial specific loudness of the signal approaches zero. Second, when $E_{NOISE}$ is well below $E_{THRQ}$, the partial specific loudness approaches the value it would have for a signal in quiet. Third, when the signal is at its masked threshold, with excitation $E_{THRN}$, it is assumed that the partial specific loudness is equal to the value that would occur for a signal at the absolute threshold. Finally, when a signal is centered in narrow-band noise is well above its masked threshold, the loudness of the signal approaches its unmasked value. Therefore, the partial specific loudness of the signal also approaches its unmasked value.

Consider the implications of these various boundary conditions. At masked threshold, the specific loudness equal that for a signal at threshold in quiet. This specific loudness is less than it would be predicted from the above equation, presumably because some of the specific loudness of the signal is assigned to the noise. In order to obtain the correct specific loudness for the signal, it is assumed that the specific loudness assigned to the noise is increased by the factor B, where $$B=\frac{[(E_{THRN}+E_{NOISE})G+A]^{\alpha}-(E_{THRQ}G+A)^{\alpha}}{E_{NOISE}G+A)^{\alpha}-A^{\alpha}}$$

Applying this factor to the second term in the above equation for $N'_{SIG}$ gives $$N_{SIG}=C\{[(E_{SIG}+E_{NOISE})G+A]^{\alpha}-A^{\alpha}\}-C\{[(E_{THRN}+E_{NOISE})G+A]^{\alpha}-(E_{THRQ}G+A)^{\alpha}\}.$$

It is assumed that when the signal is at masked threshold, its peak excitation $E_{THRN}$ is equal to $KE_{NOISE}+E_{THRQ}$, where K is the signal-to-noise ratio at the output of the auditory filter needed for threshold at higher masker levels. Recent estimates of K, obtained for masking experiments using notched noise, suggest that K increases markedly at very low frequencies, becoming greater than unity. In the reference, the value of K is estimated as a function of frequency. The value decreases from high levels at low frequencies to constant low levels at higher frequencies. Unfortunately, there are no estimates for K for center frequencies below 100 Hz, so values from 50 to 100 Hz substituting $E_{THRN}$ in the above equation results in:

$$N'_{SIG}=C\{[(E_{SIG}+E_{NOISE})G+A]^{\alpha}-A^{\alpha}\}-C\{[(E_{NOISE}(1+K)+E_{THRQ})G+A]^{\alpha}-(E_{THRQ}G+A)^{\alpha}\}$$

When $E_{SIG}=E_{THRN}$, this equation specifies the peak specific loudness for a signal at the absolute threshold in quiet.

When the signal is well above its masked threshold, that is, when $E_{SIG}>>E_{THRN}$, the specific loudness of the signal approaches the value that it would have when no background noise is present. This means that the specific loudness assigned to the noise becomes vanishingly small. To accommodate this, the above equation is modified by introducing an extra term which depends on the ratio $E_{THRN}/E_{SIG}$. This term decreases as E $E_{SIG}$ is increased above the value corresponding to masked threshold. Hence, the above equation becomes equation 17 on FIG. 10.

This is the final equation for $N'_{SIG}$ in the case when $E_{SIG}>E_{THRN}$ and $E_{SIG}+E_{NOISE}\leq 10^{10}$. The exponent 0.3 in the final term was chosen empirically so as to give a good fit to data on the loudness of a tone in noise as a function of the signal-to-noise ratio.

Subsequently, the situation is considered where $E_{SIG}<E_{THRN}$. In the limiting case where $E_{SIG}$ is just below $E_{THRN}$, the specific loudness would approach the value given in Equation 17 in FIG. 10. When $E_{SIG}$ is decreased to a value well below $E_{THRN}$, the specific loudness should rapidly become very small. This is achieved by Equation 18 in FIG. 10. The first term in parenthesis determines the rate at which a specific loudness decreases as $E_{SIG}$ is decreased below $E_{THRN}$. This describes the relationship between specific loudness and excitation for a signal in quiet when $E_{SIG}<E_{THRQ}$, except that $E_{THRN}$ has been substituted in Equation 18. The first term in braces ensures that the specific loudness approaches the value defined by Equation 17 of FIG. 10 as $E_{SIG}$ approaches $E_{THRN}$.

The equations for partial loudness described so far apply when $E_{SIG}+E_{NOISE}<10^{10}$. By applying the same reasoning as used for the derivation of equation (17) of FIG. 10, any equation can be derived for the case $E_{NOISE}\geq E_{THRN}$ and $E_{SIG}+E_{NOISE}>10^{10}$ as outlined in equation 19 in FIG. 10. $C_2-C/(1.04\times10^{6})^{0.5}$. Similarly, by applying the same reasoning as used for the derivation of equation (18) of FIG. 10, an equation can be derived for the case where $E_{SIG}<E_{THRN}$ and $E_{SIG}+E_{NOISE}>10^{10}$ as outlined in equation 20 in FIG. 10.

The following points are to be noted. This standard model is applied for the present invention where, in a first run, SIG corresponds to for example, the direct signal as the "stimulus" and Noise corresponds to for example the reverberation signal or the mix signal as the "noise". In the second run as discussed in the context of the first embodiment in FIG. 2*c*, SIG would then correspond to the reverberation signal as the "stimulus" and "noise" would correspond to the direct signal. Then, the two loudness measures are obtained which are then combined by the combiner advantageously by forming a difference.

In order to assess the suitability of the described loudness model for the task of predicting the perceived level of the late reverberation, a corpus of ground truth generated from listener responses is advantageous. To this end, data from an investigation featuring several listening test [13] is used in this paper which is briefly summarized in the following. Each listening test consisted of multiple graphical user interface screens which presented mixtures of different direct signals with different conditions of artificial reverberation. The listeners were asked to rate this perceived amount of reverberation on a scale from 0 to 100 points. In addition, two anchor signals were presented at 10 points and at 90 points. The listeners were asked to rate the perceived amount of reverberation on a scale from 0 to 100 points. In addition, two anchor signals were presented at 10 points and at 90 points. The anchor signals were created from the same direct signal with different conditions of reverberation.

The direct signals used for creating the test items were monophonic recordings of speech, individual instruments and music of different genres with a length of about 4 seconds each. The majority of the items originated from anechoic recordings but also commercial recordings with a small amount of original reverberation were used.

The RIRs represent late reverberation and were generated using exponentially decaying white noise with frequency dependent decay rates. The decay rates are chosen such that the reverberation time decreases from low to high frequencies, starting at a base reverberation time $T_{60}$. Early reflections were neglected in this work. The reverberation signal r[k] and the direct signal x[k] were scaled and added such that the ratio of their average loudness measure according to ITU-R BS.1770 [16] matches a desired DRR and such that all test signal mixtures have equal long-term loudness. All participants in the tests were working in the field of audio and had experience with subjective listening tests.

The ground truth data used for the training and the verification/testing of the prediction method were taken from two listening tests and are denoted by A and B, respectively.

The data set A consisted of ratings of 14 listeners for 54 signals. The listeners repeated the test once and the mean rating was obtained from all of the 28 ratings for each item. The 54 signals were generated by combining 6 different direct signals and 9 stereophonic reverberation conditions, with $T_{60} \in \{1,1.6,2.4\}$ s and DRR$\in\{3,7.5,12\}$ dB, and no pre-delay.

The data in B were obtained from ratings of 14 listeners for 60 signals. The signals were generated using 15 direct signals and 36 reverberation conditions. The reverberation conditions sampled four parameters, namely $T_{60}$, DRR, pre-delay, and ICC. For each direct signal 4 RIRs were chosen such that two had no pre-delay and two had a short pre-delay of 50 ms, and two were monophonic and two were stereophonic.

Subsequently, further features of an embodiment of the combiner 110 in FIG. 1 are discussed.

The basic input feature for the prediction method is computed from the difference of the partial loudness $N_{r,x}[k]$ of the reverberation signal r[k] (with the direct signal x[k] being the interferer) and the loudness $N_{x,r}[k]$ of x[k] (where r[k] is the interferer), according to Equation 2.

$$\Delta N_{r,x}[k]=N_{r,x}[k]-N_{x,r}[k] \tag{2}$$

The rationale behind Equation (2) is that the difference $\Delta N_{r,x}[k]$ is a measure of how strong the sensation of the reverberation is compared to the sensation of the direct signal. Taking the difference was also found to make the prediction result approximately invariant with respect to the playback level. The playback level has an impact on the investigated sensation [17, 8], but to a more subtle extent than reflected by the increase of the partial loudness $N_{r,x}$ with increasing playback level. Typically, musical recordings sound more reverberant at moderate to high levels (starting at about 75-80 dB SPL) than at about 12 to 20 dB lower levels. This effect is especially obvious in cases where the DRR is positive, which is valid "for nearly all recorded music" [18], but not in all cases for concert music where "listeners are often well beyond the critical distance" [6].

The decrease of the perceived level of the reverberation with decreasing playback level is best explained by the fact that the dynamic range of reverberation is smaller than that of the direct sounds (or, a time-frequency representation of reverberation is more dense whereas a time-frequency representation of direct sounds is more sparse [19]). In such a scenario, the reverberation signal is more likely to fall below the threshold of hearing than the direct sounds do.

Although equation (2) describes, as the combination operation, a difference between the two loudness measures $N_{r,x}[k]$ and $N_{x,r}[k]$, other combinations can be performed as well such as multiplications, divisions or even additions. In any case, it is sufficient that the two alternatives indicated by the two loudness measures are combined in order to have influences of both alternatives in the result. However, the experiments have shown that the difference results in the best values from the model, i.e. in the results of the model which fit with the listening tests to a good extent, so that the difference is the advantageous way of combining.

Subsequently, details of the predictor 114 illustrated in FIG. 1 are described, where these details refer to an embodiment.

The prediction methods described in the following are linear and use a least squares fit for the computation of the model coefficients. The simple structure of the predictor is advantageous in situations where the size of the data sets for training and testing the predictor is limited, which could lead to overfitting of the model when using regression methods with more degrees of freedom, e.g. neural networks. The baseline predictor $\hat{R}_b$ is derived by the linear regression according to Equation (3) with coefficients $a_i$, with K being the length of the signal in frames, $$\hat{R}_b = a_0 + a_1 \frac{1}{K} \sum_{k=1}^{K} \Delta N_{r,x}[k]. \tag{3}$$

The model has only one independent variable, i.e. the mean of $\Delta N_{r,x}[k]$. To track changes and to be able to implement a real-time processing, the computation of the mean can be approximated using a leaky integrator. The model parameters derived when using data set A for the training are $a_0=48.2$ and $a_1=14.0$, where $a_0$ equals the mean rating for all listeners and items.

Figure 5A:
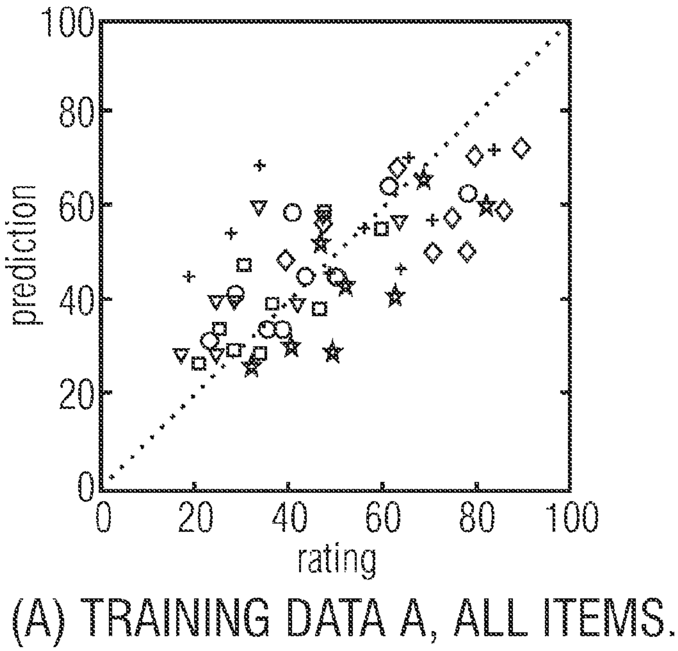
FIG. 5*a,b* illustrate information on experimental data for training the predictor.
Figure 5A:
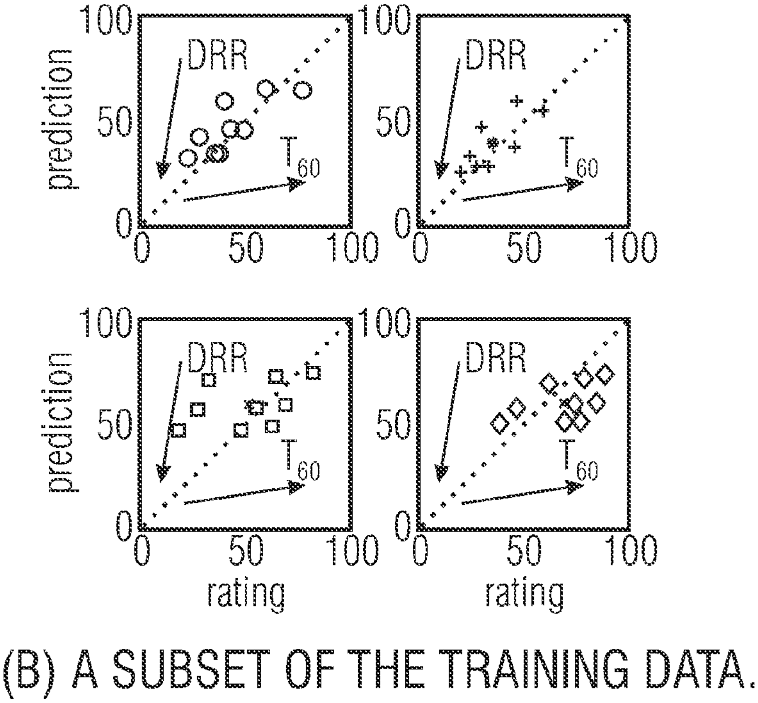
Figure 5B:
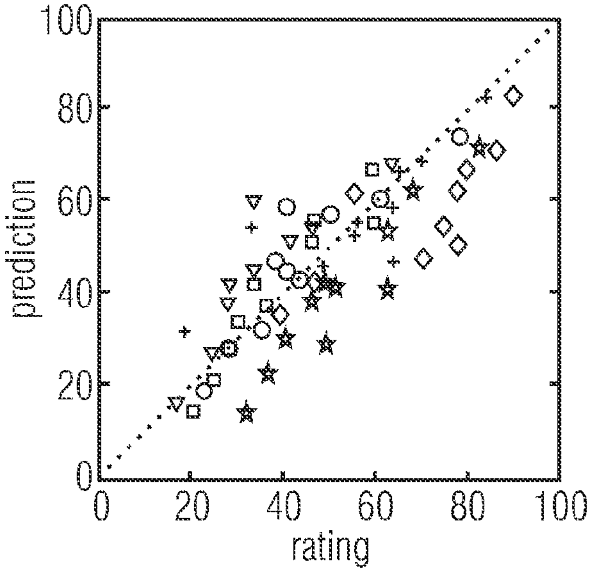
Figure 5B:
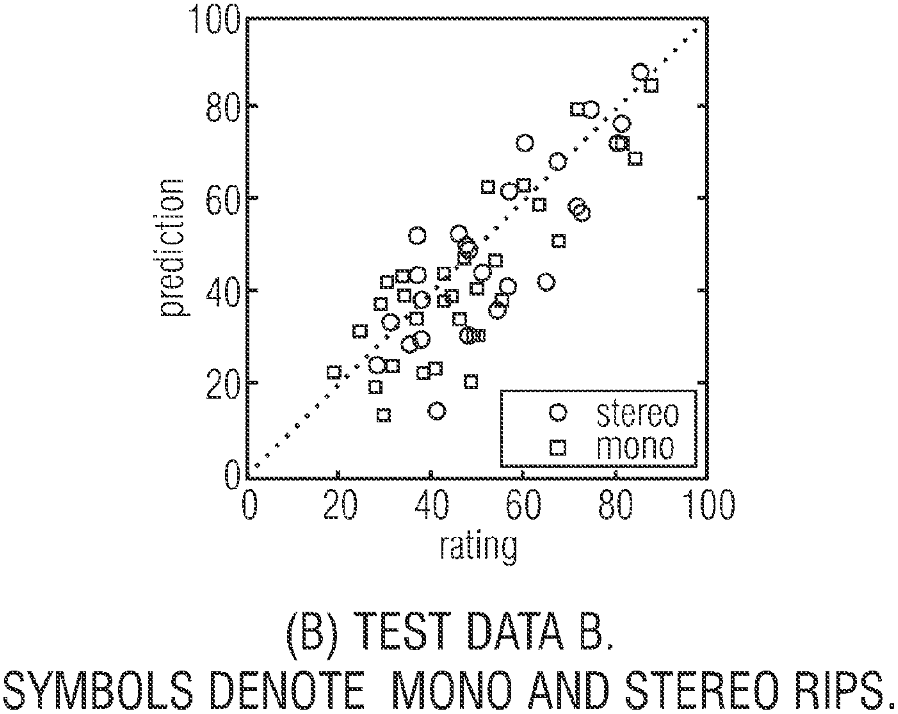

FIG. 5*a* depicts the predicted sensations for data set A. It can be seen that the predictions are moderately correlated with the mean listener ratings with a correlation coefficient of 0.71. Please note that the choice of the regression coefficients does not affect this correlation. As shown in the lower plot, for each mixture generated by the same direct signals, the points exhibit a characteristic shape centered close to the diagonal. This shape indicates that although the baseline model $\hat{R}_b$ is able to predict R to some degree, it does not reflect the influence of $T_{60}$ on the ratings. The visual inspection of the data points suggests a linear dependency on $T_{60}$. If the value of $T_{60}$ is known, as is the case when controlling an audio effect, it can be easily incorporated into the linear regression model to derive an enhanced prediction $$\hat{R}_e = a_0 + a_1 \frac{1}{K} \sum_{k=1}^{K} \Delta N_{r,x}[k] + a_2 T_{60}. \tag{4}$$

The model parameters derived from the data set A are $a_0$=48.2, $a_1$=12.9, $a_2$=10.2. The results are shown in FIG. **5*b*** separately for each of the data sets. The evaluation of the results is described in more detail in the next section.

Alternatively, an averaging over more or less blocks can be performed as long as an averaging over at least two blocks takes place, although, due to the theory of linear equation, the best results may be obtained, when an averaging over the whole music piece up to a certain frame is performed. However, for real time applications, it is advantageous to reduce the number of frames over which is averaged depending on the actual application.

Figure 9:
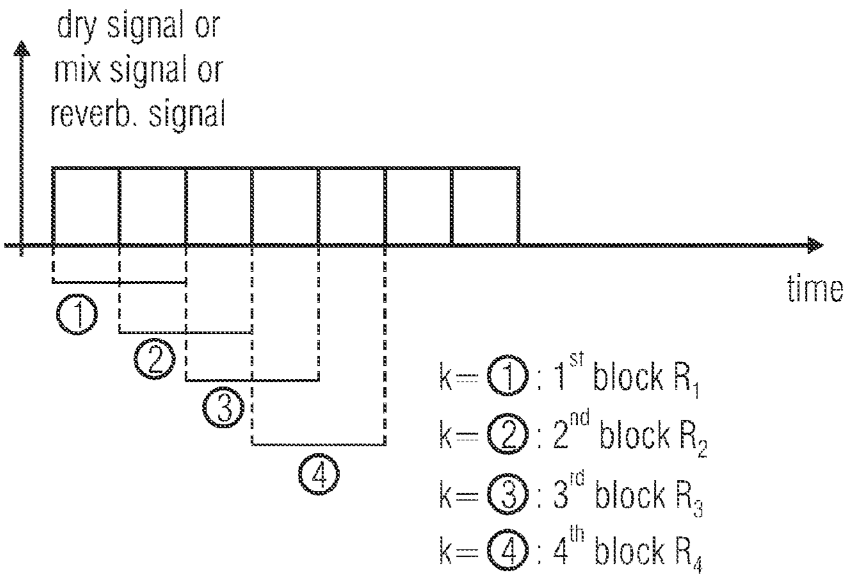
FIG. 9 illustrates an implementation of the predictor relying on time-averaged perceived levels of reverberation.
Figure 9:
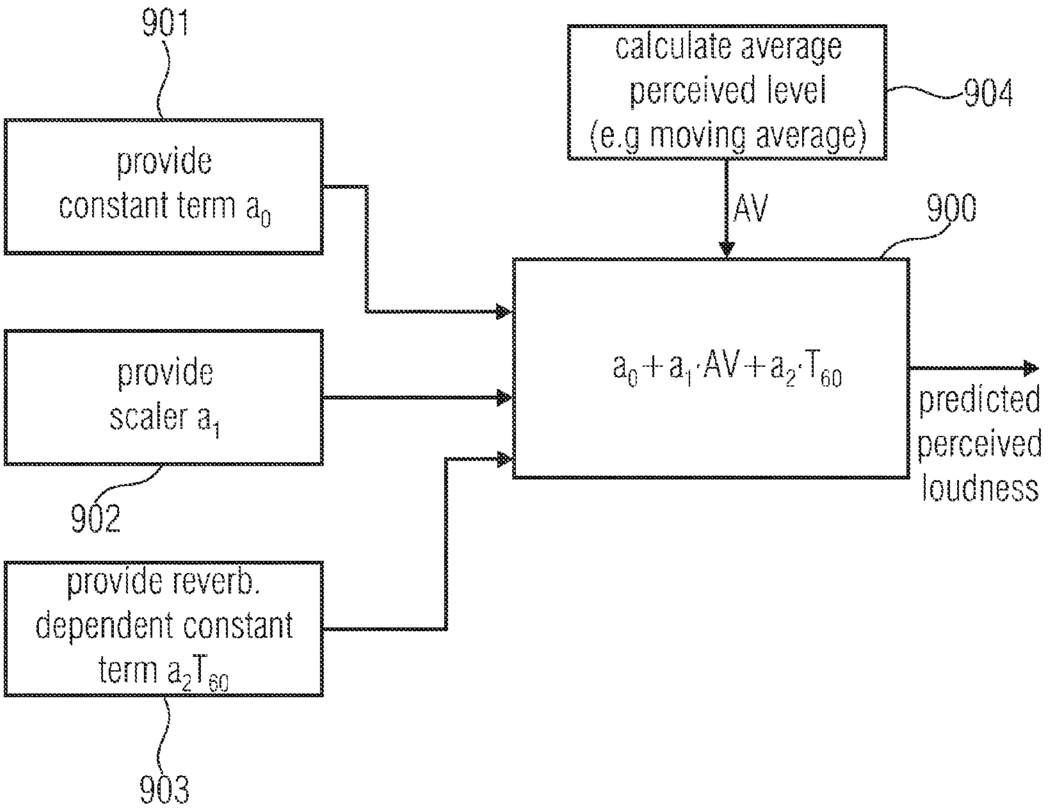

FIG. 9 additionally illustrates that the constant term is defined by $a_0$ and $a_2 \cdot T_{60}$. The second term $a_2 \cdot T$60 has been selected in order to be in the position to apply this equation not only to a single reverberator, i.e., to a situation in which the filter 600 of FIG. 6 is not changed. This equation which, of course, is a constant term, but which depends on the actually used reverberation filters 606 of FIG. 6 provides, therefore, the flexibility to use exactly the same equation for other reverberation filters having other values of $T_{60}$. As known in the art, $T_{60}$ is a parameter describing a certain reverberation filter and, particularly means that the reverberation energy has been decreased by 60 dB from an initial maximum reverberation energy value. Typically, reverberation curves are decreasing with time and, therefore, $T_{60}$ indicates a time period, in which a reverberation energy generated by a signal excitation has decreased by 60 dB. Similar results in terms of prediction accuracy are obtained by replacing $T_{60}$ by parameters representing similar information (that of the length of the RIR), e.g. $T_{30}$.

In the following, the models are evaluated using the correlation coefficient r, the mean absolute error (MAE) and the root mean squared error (RMSE) between the mean listener ratings and the predicted sensation. The experiments are performed as two-fold cross-validation, i.e. the predictor is trained with data set A and tested with data set B, and the experiment is repeated with B for training and A for testing. The evaluation metrics obtained from both runs are averaged, separately for the training and the testing.

The results are shown in Table 1 for the prediction models $\hat{R}_b$ and $\hat{R}_e$. The predictor $\hat{R}_e$ yields accurate results with an RMSE of 10.6 points. The average of the standard deviation of the individual listener ratings per item are given as a measure for the dispersion from the mean (of the ratings of all listeners per item) as $\overline{\sigma}_A$=13.4 for data set A and $\overline{\sigma}_B$=13.6 for data set B. The comparison to the RMSE indicates that $\hat{R}_e$ is at least as accurate as the average listener in the listening test.

The accuracies of the predictions for the data sets differ slightly, e.g. for $\hat{R}_e$ both MAE and RMSE are approximately one point below the mean value (as listed in the table) when testing with data set A and one point above average when testing with data set B. The fact that the evaluation metrics for training and test are comparable indicates that overfitting of the predictor has been avoided.

In order to facilitate an economic implementation of such prediction models, the following experiments investigate how the use of loudness features with less computational complexity influence the precision of the prediction result. The experiments focus on replacing the partial loudness computation by estimates of total loudness and on simplified implementations of the excitation pattern.

Instead of using the partial loudness difference $\Delta N_{r,x}[k]$, three differences of total loudness estimates are examined, with the loudness of the direct signal $N_x[k]$, the loudness of the reverberation $N_r[k]$, and the loudness of the mixture signal $N_m[k]$, as shown in Equations (5)-(7), respectively.

$$\Delta N_{m-x}[k]=N_m[k]-N_x[k] \tag{5}$$

Equation (5) is based on the assumption that the perceived level of the reverberation signal can be expressed as the difference (increase) in overall loudness which is caused by adding the reverb to the dry signal.

Following a similar rationale as for the partial loudness difference in Equation (2), loudness features using the differences of total loudness of the reverberation signal and the mixture signal or the direct signal, respectively, are defined in Equations (6) and (7). The measure for predicting the sensation is derived from as the loudness of the reverberation signal when listened to separately, with subtractive terms for modelling the partial masking and for normalization with respect to playback level derived from the mixture signal or the direct signal, respectively.

$$\Delta N_{r-m}[k]=N_r[k]-N_m[k] \tag{6}$$

$$\Delta N_{r-x}[k]=N_r[k]-N_x[k] \tag{7}$$

Table 2 shows the results obtained with the features based on the total loudness and reveals that in fact two of them, $\Delta N_{m-x}[k]$ and $\Delta N_{r-x}[k]$, yield predictions with nearly the same accuracy as $\hat{R}_e$. But as shown in Table 2, even $\Delta N_{r-n}[k]$ provides use for results.

Finally, in an additional experiment, the influence of the implementation of the spreading function is investigated. This is of particular significance for many application scenarios, because the use of the level dependent excitation patterns demands implementations of high computational complexity. The experiments with a similar processing as for $\hat{R}_e$ but using one loudness model without spreading and one loudness model with level-invariant spreading function led to the results shown in Table 2. The influence of the spreading seems to be negligible.

Therefore, equations (5), (6) and (7) which indicate embodiments 2, 3, 4 of FIG. **2*c*** illustrate that even without partial loudnesses, but with total loudnesses, for different combinations of signal components or signals, good values or measures for the perceived level of reverberation in a mix signal are obtained as well.

Figure 8:
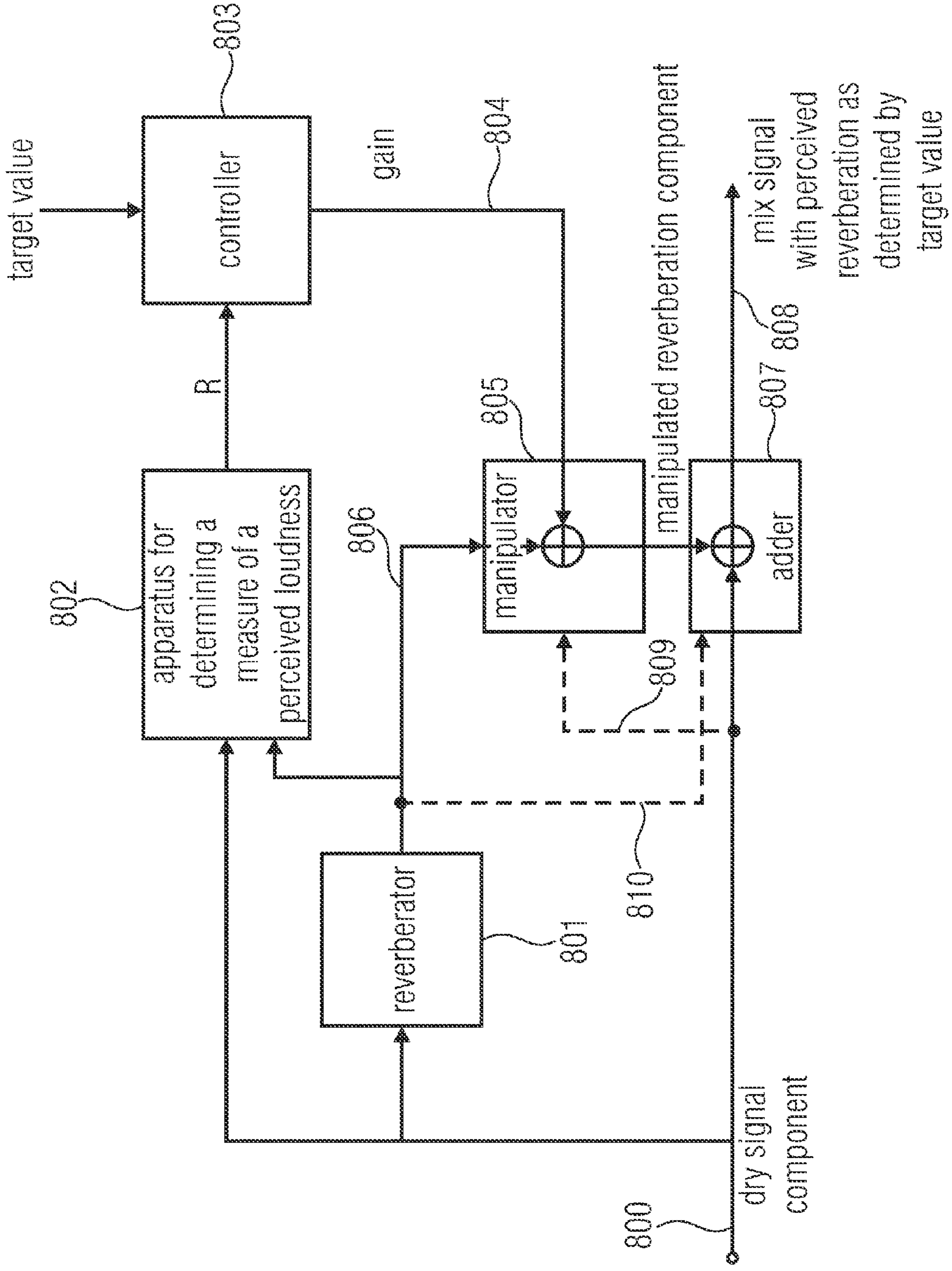
FIG. 8 illustrates an audio signal processor implemented for using the measure for a perceived level of reverberation for the purpose of artificial reverberation.

Subsequently, an application of the inventive determination of measures for a perceived level of reverberation are discussed in the context of FIG. 8. FIG. 8 illustrates an audio processor for generating a reverberated signal from a direct signal component input at an input 800. The direct or dry signal component is input into a reverberator 801, which can be similar to the reverberator 606 in FIG. 6. The dry signal component of input 800 is additionally input into an apparatus 802 for determining the measure for a perceived loudness which can be implemented as discussed in the context of FIG. 1, FIGS. 2_a_ and 2_c_, 3, 9 and 10. The output of the apparatus 802 is the measure R for a perceived level of reverberation in a mix signal which is input into a controller 803. The controller 803 receives, at a further input, a target value for the measure of the perceived level of reverberation and calculates, from this target value and the actual value R again a value on output 804.

This gain value is input into a manipulator 805 which is configured for manipulating, in this embodiment, the reverberation signal component 806 output by the reverberator 801. As illustrated FIG. 8, the apparatus 802 additionally receives the reverberation signal component 806 as discussed in the context of FIG. 1 and the other Figs. describing the apparatus for determining a measure of a perceived loudness. The output of the manipulator 805 is input into an adder 807, where the output of the manipulator comprises in the FIG. 8 embodiment the manipulated reverberation component and the output of the adder 807 indicates a mix signal 808 with a perceived reverberation as determined by the target value. The controller 803 can be configured to implement any of the control rules as defined in the art for feedback controls where the target value is a set value and the value R generated by the apparatus is an actual value and the gain 804 is selected so that the actual value R approaches the target value input into the controller 803. Although FIG. 8 is illustrated in that the reverberation signal is manipulated by the gain in the manipulator 805 which particularly comprises a multiplier or weighter, other implementations can be performed as well. One other implementation, for example, is that not the reverberation signal 806 but the dry signal component is manipulated by the manipulator as indicated by optional line 809. In this case, the non-manipulated reverberation signal component as output by the reverberator 801 would be input into the adder 807 as illustrated by optional line 810. Naturally, even a manipulation of the dry signal component and the reverberation signal component could be performed in order to introduce or set a certain measure of perceived loudness of the reverberation in the mix signal 808 output by the adder 807. One other implementation, for example, is that the reverberation time $T_{60}$ is manipulated.

The present invention provides a simple and robust prediction of the perceived level of reverberation and, specifically, late reverberation in speech and music using loudness models of varying computational complexity. The prediction modules have been trained and evaluated using subjective data derived from three listening tests. As a starting point, the use of a partial loudness model has lead to a prediction model with high accuracy when the $T_{60}$ of the RIR 606 of FIG. 6 is known. This result is also interesting from the perceptual point of view, when it is considered that the model of partial loudness was not originally developed with stimuli of direct and reverberant sound as discussed in the context of FIG. 10. Subsequent modifications of the computation of the input features for the prediction method leads to a series of simplified models which were shown to achieve comparable performance for the data sets at hand. These modifications included the use of total loudness models and simplified spreading functions. The embodiments of the present invention are also applicable for more diverse RIRs including early reflections and larger pre-delays. The present invention is also useful for determining and controlling the perceived loudness contribution of other types of additive or reverberant audio effects.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a non-transitory or tangible data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

LIST OF REFERENCES

[1] A. Czyzewski, "A method for artificial reverberation quality testing," *J. Audio Eng. Soc.*, vol. 38, pp. 129-141, 1990.

[2] J. A. Moorer, "About this reverberation business," *Computer Music Journal*, vol. 3, 1979.

[3] B. Scharf, "Fundamentals of auditory masking," *Audiology*, vol. 10, pp. 30-40, 1971.

[4] W. G. Gardner and D. Griesinger, "Reverberation level matching experiments," in *Proc. of the Sabine Centennial Symposium, Acoust. Soc. of Am.*, 1994.

[5] D. Griesinger, "How loud is my reverberation," in *Proc. Of the AES* 98$^{th}$ *Conv.*, 1995.

[6] D. Griesinger, "Further investigation into the loudness of running reverberation," in *Proc. of the Institute of Acoustics (UK) Conference*, 1995.

[7] D. Lee and D. Cabrera, "Effect of listening level and background noise on the subjective decay rate of room impulse responses: Using time varying-loudness to model reverberance," *Applied Acoustics*, vol. 71, pp. 801-811, 2010.

[8] D. Lee, D. Cabrera, and W. L. Martens, "Equal reverberance matching of music," *Proc. of Acoustics*, 2009.

[9] D. Lee, D. Cabrera, and W. L. Martens, "Equal reverberance matching of running musical stimuli having various reverberation times and SPLs," in *Proc. of the* 20$^{th}$ *International Congress on Acoustics*, 2010.

[10] A. Tsilfidis and J. Mourjopoulus, "Blind single-channel suppression of late reverberation based on perceptual reverberation modeling," *J. Acoust. Soc. Am*, vol. 129, pp. 1439-1451, 2011.

[11] B. C. J. Moore, B. R. Glasberg, and T. Baer, "A model for the prediction of threshold, loudness, and partial loudness," *J. Audio Eng. Soc.*, vol. 45, pp. 224-240, 1997.

[12] B. R. Glasberg and B. C. J. Moore, "Development and evaluation of a model for predicting the audibility of time varying sounds in the presence of the background sounds," *J. Audio Eng. Soc.*, vol. 53, pp. 906-918, 2005.

[13] J. Paulus, C. Uhle, and J. Herre, "Perceived level of late reverberation in speech and music," in *Proc. of the AES* 130$^{th}$ *Conv.*, 2011.

[14] J. L. Verhey and S. J. Heise, "Einfluss der Zeitstruktur des Hintergrundes auf die Tonhaltigkeit und Lautheit des tonalen Vordergrundes (in German)," in *Proc. of DAGA*, 2010.

[15] C. Bradter and K. Hobohm, "Loudness calculation for individual acoustical objects within complex temporally variable sounds," in *Proc. of the AES* 124$^{th}$ *Conv.*, 2008.

[16] International Telecommunication Union, Radiocommunication Assembly, "Algorithms to measure audio programme loudness and true-peak audio level," Recommendation ITU-R BS. 1770, 2006, Geneva, Switzerland.

[17] S. Hase, A. Takatsu, S. Sato, H. Sakai, and Y. Ando, "Reverberance of an existing hall in relation to both subsequent reverberation time and SPL," *J. Sound Vib.*, vol. 232, pp. 149-155, 2000.

[18] D. Griesinger, "The importance of the direct to reverberant ratio in the perception of distance, localization, clarity, and envelopment," in *Proc. of the AES* 126$^{th}$ *Conv.*, 2009.

[19] C. Uhle, A. Walther, O. Hellmuth, and J. Herre, "Ambience separation from mono recordings using Non-negative Matrix Factorization," in *Proc. of the AES* 30$^{th}$ *Conv.*, 2007.

The invention claimed is:

1. Apparatus for determining a measure for a perceived level of reverberation in a mix signal comprising a direct signal component and a reverberation signal component, comprising:

a loudness model processor comprising a perceptual filter stage configured for filtering the direct signal component to acquire a filtered direct signal, and configured for filtering the reverberation signal component to acquire a filtered reverberation signal, wherein the perceptual filter stage is configured for modeling an auditory perception mechanism of an entity a loudness estimator configured for estimating a first loudness measure using the filtered direct signal and configured for estimating a second loudness measure using the filtered reverberation signal; and a combiner for combining the first loudness measure and the second loudness measure to acquire the measure for the perceived level of reverberation.

2. Apparatus in accordance with claim 1, in which the loudness estimator is configured to estimate the first loudness measure so that the filtered direct signal is considered to be a stimulus and the filtered reverberation signal is considered to be a noise, or to estimate the second loudness measure so that the filtered reverberation signal is considered to be a stimulus and the filtered direct signal is considered to be a noise.

3. Apparatus in accordance with claim 1, in which the loudness estimator is configured to calculate the first loudness measure as a loudness of the filtered direct signal or to calculate the second loudness measure as a loudness of the filtered reverberation signal or the mix signal.

4. Apparatus in accordance with claim 1, in which the combiner is configured to calculate a difference using the first loudness measure and the second loudness measure.

5. Apparatus in accordance with claim 1, further comprising:

a predictor for predicting the perceived level of reverberation based on an average value of at least two measures for the perceived loudness for different signal frames.

6. Apparatus in accordance with claim 5, in which the predictor is configured to use, in a prediction a constant term, a linear term depending on the average value and a scaling factor.

7. Apparatus in accordance with claim 5, in which the constant term depends on the reverberation parameter describing the reverberation filter used for generating the reverberation signal in an artificial reverberator.

8. Apparatus in accordance with claim 1, in which the filter stage comprises a time-frequency conversion stage, wherein the loudness estimator is configured to sum results acquired for a plurality of bands to derive the first and the second loudness measures for a broadband mix signal comprising the direct signal component and the reverberation signal component.

9. Apparatus in accordance with claim 1, in which the filter stage comprises:

an ear transfer filter, an excitation pattern calculator, and a temporal integrator to derive the filtered direct signal or the filtered reverberation signal.

10. Method of determining a measure for a perceived level of reverberation in a mix signal comprising a direct signal component and a reverberation signal component, comprising:

filtering the direct signal component to acquire a filtered direct signal;

filtering the reverberation signal component to acquire a filtered reverberation signal, wherein the filtering of the direct signal component and the reverberation signal component is performed using a perceptual filter stage being configured for modeling an auditory perception mechanism of an entity;

estimating a first loudness measure using the filtered direct signal;

estimating a second loudness measure using the filtered reverberation signal; and combining the first loudness measure and the second loudness measure to acquire a measure for the perceived level of reverberation.

11. Audio processor for generating a reverberated signal from a direct signal component, comprising:

a reverberator for reverberating the direct signal component to acquire a reverberation signal component;

an apparatus for determining a measure for a perceived level of reverberation, the apparatus comprising:

a loudness model processor comprising a perceptual filter stage configured for filtering the direct signal component to acquire a filtered direct signal, and configured for filtering the reverberation signal component to acquire a filtered reverberation signal, wherein the perceptual filter stage is configured for modeling an auditory perception mechanism of an entity;

a loudness estimator configured for estimating a first loudness measure using the filtered direct signal and configured for estimating a second loudness measure using the filtered reverberation signal; and a combiner configured for combining the first loudness measure and the second loudness measure to acquire the measure for the perceived level of reverberation;

a controller configured for receiving the measure for the perceived level of reverberation generated by the apparatus for determining the measure for the perceived level of reverberation, and configured for generating a control signal in accordance with the measure for the perceived level of reverberation and a target value;

a manipulator configured for manipulating the direct signal component or the reverberation signal component in accordance with the control value; and a combiner configured for combining the manipulated direct signal component and the manipulated reverberation signal component, or configured for combining the direct signal component and the manipulated reverberation signal component, or configured for combining the manipulated direct signal component and the reverberation signal component to acquire the reverberated signal.

12. Apparatus in accordance with claim 11, in which the manipulator comprises a weighter configured for weighting the reverberation signal component by a gain value, the gain value being determined by the control signal, or in which the reverberator comprises a variable filter, the filter being variable in response to the control signal.

13. Apparatus in accordance with claim 12, in which the reverberator comprises a fixed filter, in which the manipulator comprises the weighter configured to generate the manipulated reverberation signal component, and in which the adder is configured for adding the direct signal component and the manipulated reverberation signal component to acquire the reverberated signal.

14. Method of processing an audio signal for generating a reverberated signal from a direct signal component, comprising:

reverberating the direct signal component to acquire a reverberation signal component;

a method of determining a measure for a perceived level of reverberation, the method comprising:

filtering the direct signal component to acquire a filtered direct signal;

filtering the reverberation signal component to acquire a filtered reverberation signal, wherein the filtering the direct signal component and the reverberation signal component is performed using a perceptual filter stage being configured for modeling an auditory perception mechanism of an entity;

estimating a first loudness measure using the filtered direct signal;

estimating a second loudness measure using the filtered reverberation signal; and combining the first loudness measure and the second loudness measure to acquire the measure for the perceived level of reverberation;

receiving the measure for the perceived level of reverberation generated by the method for determining the measure for the perceived level of reverberation, generating a control signal in accordance with the perceived level of reverberation and a target value;

manipulating the direct signal component or the reverberation signal component in accordance with the control value; and combining the manipulated direct signal component and the manipulated reverberation signal component, or combining the direct signal component and the manipulated reverberation signal component, or combining the manipulated direct signal component and the reverberation signal component to acquire the mix signal.

15. A non-transitory storage medium having stored thereon a computer program comprising a program code for performing, when running on a computer, the method of determining a measure for a perceived level of reverberation in a mix signal comprising a direct signal component and a reverberation signal component, comprising:

filtering the direct signal component to acquire a filtered direct signal;

filtering the reverberation signal component to acquire a filtered reverberation signal, wherein the filtering is performed using a perceptual filter stage being configured for modeling an auditory perception mechanism of an entity;

estimating a first loudness measure using the filtered direct signal;

estimating a second loudness measure using the filtered reverberation signal; and combining the first loudness measure and the second loudness measure to acquire the measure for the perceived level of reverberation.

16. A non-transitory storage medium having stored thereon a computer program comprising a program code for performing, when running on a computer, the method of processing an audio signal for generating a reverberated signal from a direct signal component, comprising:

reverberating the direct signal component to acquire a reverberation signal component;

a method of determining a measure for a perceived level of reverberation, the method comprising:

filtering the direct signal component to acquire a filtered direct signal;

filtering the reverberation signal component to acquire a filtered reverberation signal, wherein the filtering the direct signal component and the filtering the reverberation signal component is performed using a perceptual filter stage being configured for modeling an auditory perception mechanism of an entity;

estimating a first loudness measure using the filtered direct signal;

estimating a second loudness measure using the filtered reverberation signal; and combining the first loudness measure and the second loudness measure to acquire a measure for the perceived level of reverberation;

receiving the measure for the perceived level of reverberation generated by the method for determining the measure for the perceived level of reverberation, generating a control signal in accordance with the measure for the perceived level of reverberation and a target value;

manipulating the direct signal component or the reverberation signal component in accordance with the control value; and combining the manipulated direct signal component and the manipulated reverberation signal component, or combining the direct signal component and the manipulated reverberation signal component, or combining the manipulated direct signal component and the reverberation signal component to acquire the reverberated signal.

17. Apparatus for determining a measure for a perceived level of reverberation in a mix signal comprising a direct signal component and a reverberation signal component, comprising:

a loudness model processor comprising a perceptual filter stage for filtering the direct signal component to acquire a filtered direct signal, and configured for filtering the mix signal to acquire a filtered mix signal, wherein the perceptual filter stage is configured for modeling an auditory perception mechanism of an entity;

a loudness estimator configured for estimating a first loudness measure using the filtered direct signal and configured for estimating a second loudness measure using the filtered mix signal, wherein the filtered mix signal is derived from a superposition of the direct signal component and the reverberation signal component; and a combiner for combining the first loudness measure and the second loudness measure to acquire the measure for the perceived level of reverberation.

18. Method of determining a measure for a perceived level of reverberation in a mix signal comprising a direct signal component and a reverberation signal component, the method comprising:

filtering the direct signal component to acquire a filtered direct signal;

filtering the mix signal to acquire a filtered mix signal, wherein the filtering the direct signal and the mix signal is performed using a perceptual filter stage being configured for modeling an auditory perception mechanism of an entity;

estimating a first loudness measure using the filtered direct signal;

estimating a second loudness measure using the filtered mix signal, wherein the filtered mix signal is derived from a superposition of the direct signal component and the reverberation signal component; and combining the first loudness measure and the second loudness measures to acquire the measure for the perceived level of reverberation.

19. A non-transitory storage medium having stored thereon a computer program comprising a program code for performing, when running on a computer, the method of determining a measure for a perceived level of reverberation in a mix signal comprising a direct signal component and a reverberation signal component, comprising:

filtering the direct signal component to acquire a filtered direct signal;

filtering the mix signal to acquire a filtered mix signal, wherein the filtering of the direct signal component and the mix signal is performed using a perceptual filter stage being configured for modeling an auditory perception mechanism of an entity;

estimating a first loudness measure using the filtered direct signal;

estimating a second loudness measure using the filtered mix signal, wherein the filtered mix signal is derived from a superposition of the direct signal component and the reverberation signal component; and combining the first loudness measure and the second loudness measure to acquire the measure for the perceived level of reverberation.

* * * * *